United States Patent
Higuchi et al.

(10) Patent No.: US 7,261,792 B2
(45) Date of Patent: Aug. 28, 2007

(54) METHOD OF PRODUCING PIEZOELECTRIC COMPONENT AND PIEZOELECTRIC COMPONENT

(75) Inventors: Masato Higuchi, Kanazawa (JP); Nobushige Araki, Kanazawa (JP); Hideki Shinkai, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 153 days.

(21) Appl. No.: 10/728,540

(22) Filed: Dec. 5, 2003

(65) Prior Publication Data

US 2004/0169444 A1 Sep. 2, 2004

(30) Foreign Application Priority Data

Dec. 6, 2002 (JP) ............................. 2002-354712
Nov. 7, 2003 (JP) ............................. 2003-378190

(51) Int. Cl.
*B32B 38/04* (2006.01)
*B32B 37/04* (2006.01)
*H01L 41/053* (2006.01)

(52) U.S. Cl. .................. 156/250; 156/300; 156/308.2; 310/348

(58) Field of Classification Search ................ 156/250, 156/267, 272.2, 272.6, 272.8, 273.3, 297, 156/299, 300, 308.2; 310/311, 313 R, 313 B, 310/326, 327, 340, 348
See application file for complete search history.

(56) References Cited

U.S. PATENT DOCUMENTS

| | | | | |
|---|---|---|---|---|
| 4,058,443 A | * | 11/1977 | Murata et al. | 430/281.1 |
| 5,346,982 A | * | 9/1994 | Tamai et al. | 528/183 |
| 6,228,688 B1 | * | 5/2001 | Ohta et al. | 438/127 |
| 6,262,513 B1 | * | 7/2001 | Furukawa et al. | 310/313 R |
| 6,492,194 B1 | * | 12/2002 | Bureau et al. | 438/106 |
| 6,498,422 B1 | | 12/2002 | Hori | |
| 6,663,943 B2 | * | 12/2003 | Kadota | 428/156 |
| 6,722,030 B1 | * | 4/2004 | Stelzl et al. | 29/841 |
| 6,798,121 B2 | * | 9/2004 | Nakatani et al. | 310/340 |
| 2001/0011857 A1 | | 8/2001 | Morishima | |
| 2002/0044030 A1 | * | 4/2002 | Uchikoba | 333/193 |
| 2004/0160750 A1 | * | 8/2004 | Masuko | 361/761 |
| 2005/0029906 A1 | * | 2/2005 | Miyaji | 310/348 |
| 2006/0053607 A1 | * | 3/2006 | Onozawa | 29/25.35 |

(Continued)

FOREIGN PATENT DOCUMENTS

GB 2 340 300 2/2000

(Continued)

OTHER PUBLICATIONS

Official Communication issued in the corresponding Korean Application No. 10-2003-0087568 dated Oct. 19, 2005.

(Continued)

*Primary Examiner*—Melvin Mayes
(74) *Attorney, Agent, or Firm*—Keating & Bennett, LLP

(57) ABSTRACT

A surface acoustic wave element is mounted onto a mounting substrate having a terminal electrode via a bump by flip chip bonding. The surface acoustic wave element is covered with a resin film. The periphery of the surface acoustic wave element mounted on the mounting substrate is covered with a portion of the resin film so that the surface acoustic wave element is sealed. The resin film is hardened. Thus, a surface acoustic wave device is provided.

3 Claims, 28 Drawing Sheets

U.S. PATENT DOCUMENTS

2006/0150381 A1 * 7/2006 Anzai et al. ................ 29/25.35

FOREIGN PATENT DOCUMENTS

| | | | |
|---|---|---|---|
| GB | 2 340 300 A | | 2/2000 |
| JP | 61-295025 | * | 12/1986 |
| JP | 5-55303 | * | 3/1993 |
| JP | 7-176565 | * | 7/1995 |
| JP | 07-321583 | | 12/1995 |
| JP | 08-204497 | | 8/1996 |
| JP | 10-125825 | | 5/1998 |
| JP | 10-321666 | | 12/1998 |
| JP | 2943764 | | 6/1999 |
| JP | 2000-004139 | | 1/2000 |
| JP | 2000-077970 | | 3/2000 |
| JP | 2000-77970 A | | 3/2000 |
| JP | 2001-110946 | * | 4/2001 |
| JP | 2002-16475 | | 1/2002 |
| JP | 2002-217219 | | 8/2002 |
| JP | 2002-217220 | * | 8/2002 |
| JP | 2002-217221 | * | 8/2002 |
| JP | 2002-217523 | | 8/2002 |
| JP | 2002-330049 | * | 11/2002 |
| JP | 2003-32061 | * | 1/2003 |
| JP | 2003-283295 | * | 10/2003 |
| JP | 2003-298389 | * | 10/2003 |
| JP | 2004-253839 | * | 9/2004 |
| KR | 2001-92458 | | 10/2001 |
| WO | WO97/02596 | | 1/1997 |
| WO | 2004/032321 | * | 4/2004 |

OTHER PUBLICATIONS

Official communication issued in the corresponding Chinese Patent Application No. 2003101201160, mailed on Feb. 24, 2006.

Official Communication cited in corresponding Chinese Patent Patent Application No. 200310120116.0, dated Aug. 25, 2006.

* cited by examiner

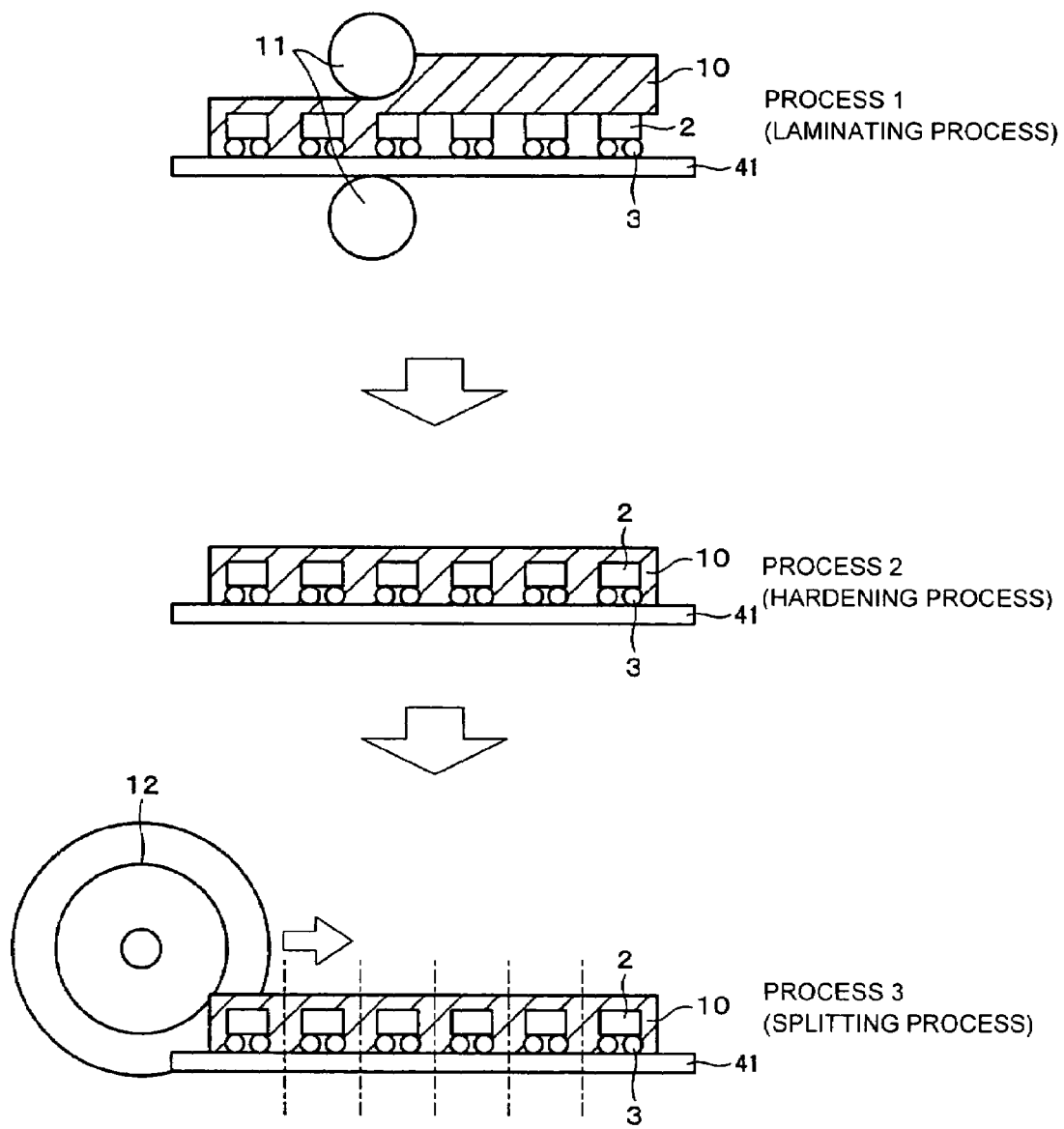

GAP BETWEEN ELEMENT AND SUBSTRATE [μm]

FIG. 8
PROCESS 1a
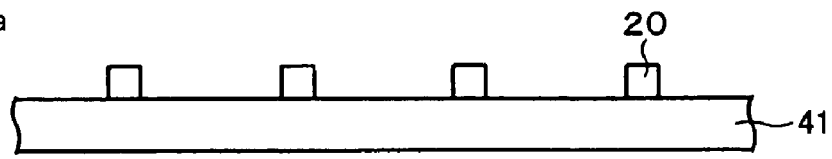
PROCESS 1b
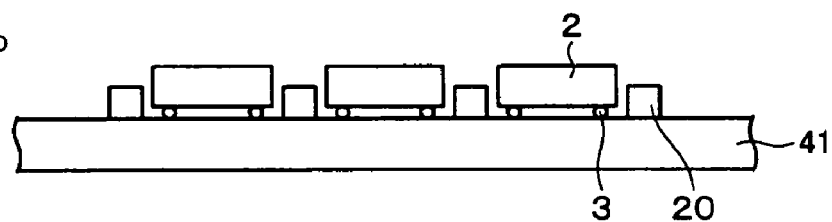
PROCESS 1c
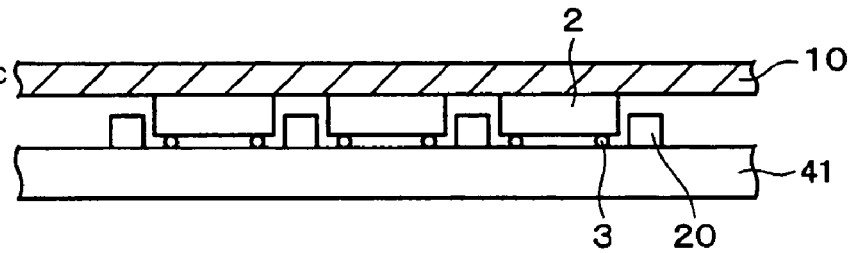
PROCESS 2
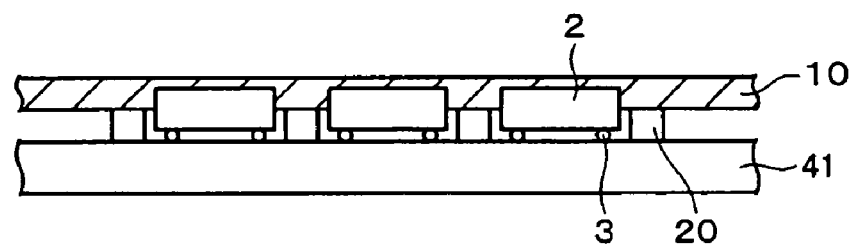
PROCESS 3
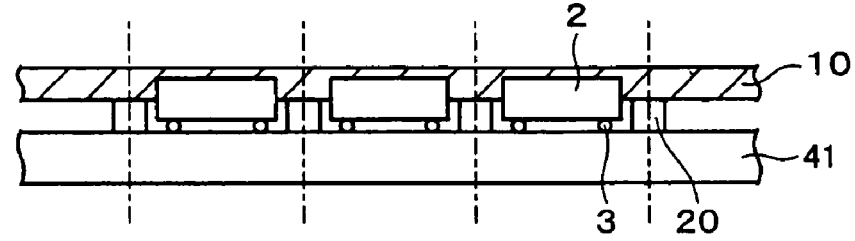

FIG. 11
PROCESS 1d
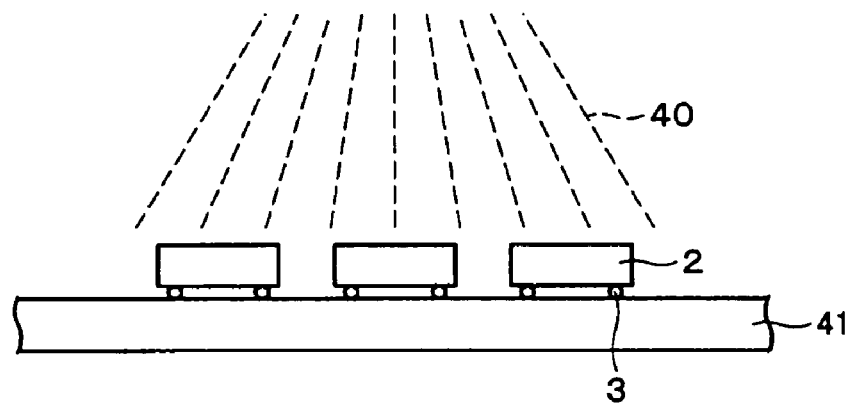
PROCESS 1e
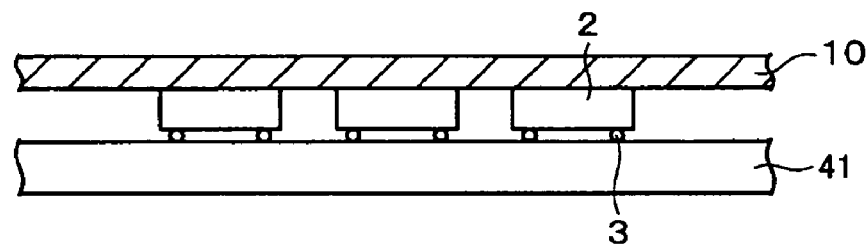
PROCESS 2
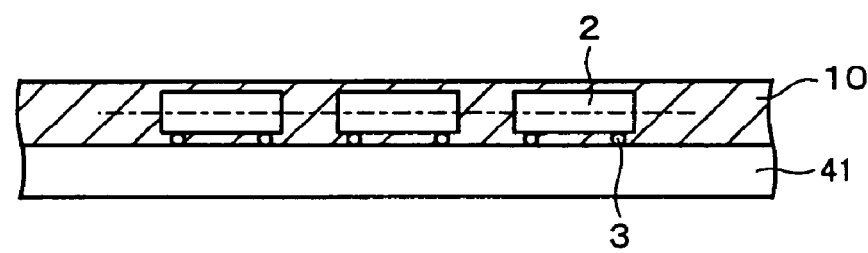
PROCESS 3
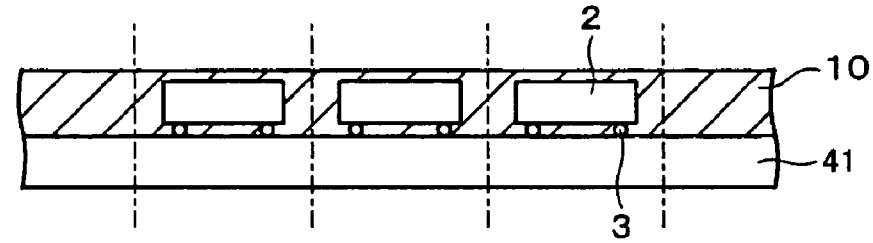

θ=90°

θ<90°

θ>90°

METHOD OF PRODUCING PIEZOELECTRIC COMPONENT AND PIEZOELECTRIC COMPONENT

BACKGROUND OF THE INVENTION

1. Field of the Invention

The present invention relates to a piezoelectric component suitable for use in a filter of an electronic device, e.g., a mobile communication device such as a portable telephone, and also relates to a method of producing such a piezoelectric component.

2. Description of the Related Art

Recently, the sizes and weights of mobile communication devices such as automobile telephones and portable telephones have decreased, and the frequencies at which the devices are operated have been enhanced. In many cases, surface acoustic wave devices (piezoelectric components), which have small sizes and light weights, are used as filters mounted in these mobile communication devices. Especially, it is required to reduce the sizes and the weights of portable telephones. Accordingly, for electronic components to be mounted in such devices, it is also required to reduce the sizes and the weights thereof.

Surface acoustic wave devices utilize surface acoustic waves which are propagated along the piezoelectric substrates. Thus, it is necessary to protect the surface portions (functioning portions) of the devices, on which surface acoustic waves are propagated, from water, dust, and other similar contaminants. According to a conventional method of packaging a surface acoustic wave device, a surface acoustic wave element (piezoelectric element) is mounted onto a case-type package made of alumina or other suitable material by wire-bonding or flip chip bonding. Then, a cover (lid) made of a metal or ceramic is soldered to the package, and the package is air-tightly sealed by welding, soldering, or other similar sealing means, or by use of glass or suitable material.

However, according to the above-described packaging structure, if the sizes of the case-type packages onto which surface acoustic wave elements are mounted are not reduced, the sizes and the heights of surface acoustic wave devices cannot be reduced, even if the sizes of surface acoustic wave elements are reduced by the advanced techniques for fine wiring. Moreover, the expenditure of small-sized case-type packages is high. Therefore, surface acoustic wave devices to which chip size packages are applied using flip chip bonding used in the semiconductor component fields have been developed.

For example, a method is disclosed in Japanese Unexamined Patent Application Publication No. 8-204497 and in Japanese Unexamined Patent Application Publication No. 7-321583, in which plural surface acoustic wave elements, which are mounted on a mounting substrate by flip chip bonding, are sealed with a resin, and thereafter, the elements are diced into respective chips. This method is disadvantageous in that a liquid resin invades the surface acoustic wave propagation portion (functioning portion), and thereby, a deficient device which must be rejected is produced.

A countermeasure against the formation of such a rejected device has been disclosed in Japanese Unexamined Patent Application Publication No. 10-321666 in which a dam is provided on a surface acoustic wave element or a mounting substrate. However, when the velocity and the pressure at which the liquid resin is flowed into are varied and when the flowing-in speed of the liquid resin and the flowing-in pressure are increased, this countermeasure will be ineffective in solving the above-described problem. For this reason, a rejected device is formed, which is caused by the liquid resin invading the surface acoustic wave propagation area (vibrating portion, functioning portion) of the surface acoustic wave element. Moreover, air-bubbles are trapped in the liquid resin so that voids are formed. Thus, a sealing deficiency is caused. Moreover, the conventional method of forming a dam has problems in that the heights of the dams and the bumps may be different from each other, causing the adhesion strengths of the bumps to be reduced, and moreover, the formation of the dam increases the size of the surface acoustic wave element.

Moreover, conventional methods, in which a resin film is bonded to a surface acoustic wave element mounted by flip chip bonding so that the mounted element is sealed, and thereafter, the elements are diced into the respective chips, are disclosed, for example, in Japanese Unexamined Patent Application Publication No. 8-204497, International Patent Application Publication WO97/02596, Japanese Unexamined Patent Application Publication No. 2002-217221, Japanese Unexamined Patent Application Publication No. 2002-217523, Japanese Unexamined Patent Application Publication No. 2000-4139, Japanese Unexamined Patent Application Publication No. 2002-217219, and Japanese Unexamined Patent Application Publication No. 2002-217220. According to these conventional methods, for production of a surface acoustic wave device, a resin film is caused to adhere to the whole of the surface acoustic wave element by utilization of the flexibility of the resin film.

According to the above-described known techniques, inevitably, a resin film, which is thin and flexible, must be used for the above-described adhesion. Accordingly, in a finished device, an external impact tends to be applied directly to the surface acoustic wave element. As a result, the surface acoustic wave element is probably broken, or the bump is released by an impact caused when the device is mounted onto a user-side board. Moreover, various methods of bonding resin films have been disclosed. However, these methods have problems.

According to Japanese Unexamined Patent Application Publication No. 8-204497, a resin film is bonded to a mounting substrate by use of an adhesive or other similar material, as shown in FIG. 28. According to International Patent Application Publication WO97/02596, a resin film is heated to be deformed so that the film is bonded to a mounting substrate. However, because a hot-melted resin film is made to cover from the upper side, air-bubbles may be trapped by the resin film. Furthermore, the resin film may become substantially liquid, unless the melting of the resin film is properly controlled. Thus, the resin is in danger of flowing into a vibration space.

According to Japanese Unexamined Patent Application Publication No. 2002-217221 and Japanese Unexamined Patent Application Publication No. 2002-217523, a resin film is heated and pressed by a jig so that the resin film is bonded to a mounting substrate. However, according to these methods, it is necessary for the substrate and the film to have a large area in which they are heated and pressed for bonding the mounting substrate and the resin film to each other. Accordingly, it is difficult to produce a small-sized surface acoustic wave device. Moreover, the surface acoustic wave devices produced by the above-described methods are sealed with thin resin films. Thus, the air-tightness is insufficient.

According to Japanese Unexamined Patent Application Publication No. 2000-4139, the surface acoustic wave device sealed with a resin film is further sealed with a resin.

However, this method is disadvantageous in reduction of the height of the device because the height is increased by the thickness of the resin in addition to that of the resin film.

According to Japanese Unexamined Patent Application Publication No. 2002-217219, a resin film is vacuum-formed. Further, according to Japanese Unexamined Patent Application Publication No. 2002-217220, a resin film is pre-formed so that no air-bubbles are formed. However, these methods have problems in that an exclusive-use apparatus is required for the processing, the number of processes is increased, and the manufacturing cost is high.

The above-described problems also occur in piezoelectric components such as piezoelectric resonators and piezoelectric filters in each of which piezoelectric resonators are arranged in a ladder configuration. The piezoelectric resonator contains a Si substrate having an opening or concavity and a vibration portion. The vibration portion is positioned to cover the opening or concavity and has a structure in which a pair of upper and lower electrodes in opposition to each other are placed on the upper and lower surfaces of a piezoelectric thin-film having at least one layer (e.g., made of ZnO and AlN) so that the thin film is sandwiched between the upper and lower electrodes.

SUMMARY OF THE INVENTION

To overcome the problems described above, preferred embodiments of the present invention provide a method of producing a piezoelectric component in which a mounting substrate and a surface acoustic wave element (piezoelectric element) is securely sealed with a resin film and in which the reliability is high and the production cost is low.

According to the first preferred embodiment of the present invention, a method of producing a piezoelectric component includes the steps of forming a plurality of piezoelectric elements having a vibrating portion and a bump on a substrate, mounting the plurality piezoelectric elements on a mounting substrate having external terminals via the bumps by flip chip bonding such that the vibrating portions are opposed to the mounting substrate, arranging a resin film on the mounting substrate having the plurality of piezoelectric elements mounted thereon, sealing the plurality of piezoelectric elements by embedding the resin film between adjacent piezoelectric elements mounted on the mounting substrate, hardening the resin film, and splitting the mounting substrate by dicing to form individual piezoelectric components. The sealing step includes a step of hot-press bonding in which the resin film is heated, softened, and simultaneously pressed by a roller.

According to this preferred embodiment, for chip-size packaged piezoelectric components, the piezoelectric elements are mounted onto the mounting substrate having the external terminals by flip chip bonding. The resin film is used to seal the piezoelectric elements. The resin film is heated and pressed to be deformed so that the piezoelectric elements are embedded (the resin film is filled between piezoelectric elements).

According to this preferred embodiment, a liquid resin is preferably not used, but the resin film is used to seal the piezoelectric elements. Therefore, the resin is prevented from flowing into the vibrating portion of a piezoelectric element. Thereby, it is unnecessary to provide a dam or similar structures, and the size of the piezoelectric component is reduced. Moreover, because no liquid resin is used, generation of voids (holes, vanities, or other similar deformities) is prevented. In the step of sealing the piezoelectric elements by use of the resin film, the heating and the pressing are simultaneously carried out by a roller. Accordingly, this step can be easily carried out compared to a process of bonding a resin film to a mounting substrate. The whole of the piezoelectric element can be securely covered with the resin. Thus, the piezoelectric element is sufficiently protected. Accordingly, the piezoelectric component is provided in which the reliability is high, the size is small, and the production cost is low.

Preferably, in the step of hot-press bonding, the mounting substrate having the piezoelectric elements mounted thereon is passed between two rollers. Also, preferably, in the step of hot-press bonding, the mounting substrate having the piezoelectric elements mounted thereon is fixed on a flat-surface stage for the hot-press bonding. In this case, the mounting substrate may be passed between two rollers to be heated and pressed, or a roller may be applied onto the mounting substrate while the substrate is placed on a flat surface, so that the resin film can be hot-press bonded to the mounting substrate.

According to the above-described method, the resin film is heated and pressed by a roller, and thus, the piezoelectric component is easily produced. Preferably, the roller is applied to the mounting substrate from one end thereof to the other end thereof. Accordingly, the air between the mounting substrate and the resin film can efficiently escape therefrom. Thus, generation of voids in the sealing resin formed of the resin film is prevented.

Preferably, in the sealing step, a step of pressing the resin film from the upper side thereof is carried out by use of a mold-frame after the hot-press bonding step. Also, preferably, in the sealing step, the hot-press bonding step is carried out by use of a mold-frame after hot-press bonding step.

Because the pressing (press) process is carried out using the mold-frame, the adhesion of the resin film to the mounting substrate is enhanced.

Preferably, in the sealing step, the hot-press bonding step is repeated.

Preferably, in the sealing step, after the step of pressing the resin film from the upper side thereof is carried out, the hot-press bonding step and the pressing step are sequentially carried out using the mold-frame.

Preferably, in the sealing step, the hot-press bonding step is repeated, and thereafter, the step of pressing the resin film from the upper side thereof is carried out by use of the mold-frame.

When the resin film is embedded between adjacent piezoelectric elements mounted on the mounting substrate by one embedding-process, the mounting substrate will be broken if the embedding pressure is excessively high, or the embedding of the resin film will be insufficient, if the pressure is small.

According to the above-described methods, the resin film is embedded by plural embedding-processes. Thus, the above-described inconveniences are eliminated.

Preferably, the method of producing a piezoelectric component further includes, after the arranging step, a step of disposing a resin-flowing-out preventing frame on the end portion of the mounting substrate.

According to the above-described method, the resin flowing-out preventing frame effectively prevents the resin from flowing out when the resin film is heated and pressed by a roller. Moreover, the resin has a constant thickness. When an outer frame having its surface coated with a fluororesin such as polytetrafluoroethylene or other suitable fluororesin is used, the resin softened and stuck to the outer frame in a subsequent process is easily peeled off therefrom.

Preferably, after the mounting step, a sealing-assisting piece is formed between adjacent piezoelectric elements mounted on the mounting substrate. The sealing-assisting piece may be formed before or after the mounting step.

The sealing-assisting pieces may be provided by bonding a sheet having a plurality of openings to the mounting substrate. In this case, after the sealing-assisting pieces are formed by bonding of the sheet having the plurality of openings to the mounting substrate, piezoelectric elements may be mounted to the mounting substrate through the openings.

Preferably, the height of the sealing-assisting pieces is larger than the height of the bumps and is smaller than the height of the piezoelectric elements mounted by flip chip bonding.

According to the above-described method, the distance between the resin film and the sealing-assisting piece is small. Thus, it is not necessary to deflect the resin film to a great degree. The gaps between the resin film and the sealing-assisting pieces are hardly formed. The adhesion is enhanced so that the fixing strength between the resin film and the sealing-assisting pieces is increased. That is, the fixing strength between the resin film and the mounting substrate is enhanced.

Preferably, the mounting substrate is surface-modification-treated by plasma-irradiation, UV-irradiation, corona-discharge, excimer-laser irradiation, or sand-blasting before or after the mounting step.

The surface-modification-treatment of the mounting substrate enhances the adhesion between the resin film and the mounting substrate.

Preferably, the gaps between the piezoelectric elements mounted on the mounting substrate via the bumps by flip chip bonding and the mounting substrate are in the range of about 10 μm to about 50 μm. Thereby, the resin can be prevented from flowing in between the mounting substrate and the piezoelectric elements.

Preferably, the distance D between the plurality of piezoelectric elements mounted on the mounting substrate and the thickness t of the piezoelectric elements involving the bumps satisfy the relationship $D/t>2$. Thereby, the resin is filled-in between piezoelectric elements without formation of voids.

Also, preferably, the height d of the piezoelectric component, the volume V of an piezoelectric element including the bumps and the gap between the piezoelectric element and the mounting substrate, the number n of piezoelectric elements per unit area on the mounting substrate, the thickness t1 of the resin film, and the average thickness t2 of the mounting substrate (cross-sectional area/length of substrate) satisfy the relationship $0.8<d/(nV+t1+t2)<1.1$. Thus, the piezoelectric elements are sealed with the resin, while the resin film is prevented from being broken or being partially wounded.

Preferably, the resin film has a volume-resistivity of up to about $10^{10}$ Ω·m.

According to the above-described method, electric charges generated on the piezoelectric elements are quickly migrated to the resin film so that the electric charges are neutralized (escaped). Thus, the generated electric charges are prevented from being discharged. Thus, the piezoelectric elements are prevented from braking. Thus, the piezoelectric component is produced with high stability.

The method of various preferred embodiments of the present invention may further include a step of forming an electroconductive layer on the back surface of a piezoelectric element after the mounting step.

According to the above-described method, electric charges generated on the piezoelectric elements are quickly migrated to the conductive layer so that the electric charges are neutralized (escaped). Thus, the generated electric charges are prevented from being discharged. Thus, the piezoelectric elements are prevented from braking, which is caused by the discharge. Thus, the piezoelectric component is produced with high stability.

Moreover, the method of producing a piezoelectric component according to preferred embodiments of the present invention may further include a step of forming an electroconductive layer on the hardened resin film after the hardening step.

According to the above-described method, electric charges generated on the piezoelectric elements are quickly migrated to the conductive layer so that the electric charges are neutralized (escaped). Thus, the generated electric charges are prevented from being discharged. Thus, the piezoelectric elements are prevented from braking, which is caused by the discharge. Thus, the piezoelectric component is produced with a high acceptance ratio.

In the method of producing a piezoelectric component, the piezoelectric element may be a surface acoustic wave element having at least one interdigital electrode on the surface of a piezoelectric substrate.

Also, the piezoelectric element may be a piezoelectric thin-film element including a substrate having an opening or concavity and a vibrating portion. The vibration portion has a structure in which a piezoelectric thin-film having at least one layer is sandwiched between a pair of upper and lower electrodes opposed to each other. The vibrating portion is positioned over the opening or concavity.

Moreover, according to other preferred embodiments of the present invention, piezoelectric components are produced according to any of the above-described production methods. Thus, a piezoelectric component is provided in which the reliability is high, the size is small, and the production cost is low.

According to the fourth preferred embodiment of present invention, a piezoelectric component includes a piezoelectric element having a vibrating portion formed on the surface of a substrate, a mounting substrate having an external terminal and onto which the piezoelectric element is mounted by flip chip bonding via a bump while the surface of the piezoelectric element on which the vibrating portion is formed is opposed to the mounting substrate, and a resin sealing the piezoelectric element mounted onto the mounting substrate. The resin has a volume resistivity of up to about $10^{10}$ Ω·m.

As described above, the resin has a volume resistivity of up to about $10^{10}$ Ω·m. Thus, electric charges generated on the piezoelectric elements is quickly migrated to the resin film so that the electric charges are neutralized (escaped). Thus, the generated electric charges are prevented from being discharged. Thus, a piezoelectric component is provided and has a piezoelectric element that is prevented from being broken by the discharge.

Also, according to another preferred embodiment of the present invention, a piezoelectric component includes a piezoelectric element having a vibrating portion provided on the surface of a substrate, a mounting substrate having an external terminal and onto which the piezoelectric element is mounted by flip chip bonding via a bump while the surface of the piezoelectric element on which the vibrating portion is formed is opposed to the mounting substrate, and a resin sealing the piezoelectric element mounted onto the mounting substrate. The piezoelectric element has a back-surface conductive layer disposed on the back surface thereof.

Thereby, electric charges generated on the piezoelectric elements are quickly migrated to the back-surface conductive layer so that the electric charges are neutralized (escaped). Thus, the generated electric charges are prevented from being discharged. Thus, a piezoelectric component is provided, of which the piezoelectric element is prevented from being broken by the discharge.

According to another preferred embodiment of the present invention, a piezoelectric component includes a piezoelectric element having a vibrating portion provided on the surface of a substrate, a mounting substrate having an external terminal and onto which the piezoelectric element is mounted by flip chip bonding via a bump while the surface of the piezoelectric element on which the vibrating portion is formed is opposed to the mounting substrate, and a resin sealing the piezoelectric element mounted onto the mounting substrate. The resin has a surface conductive layer provided thereon.

Thereby, electric charges generated on the piezoelectric elements are quickly migrated to the surface conductive layer so that the electric charges are neutralized (escaped). Thus, the generated electric charges are prevented from being discharged. Thus, a piezoelectric component is provided and has a piezoelectric element that is prevented from being broken by the discharge.

Preferably, at least one of the back-surface conductive layer and the surface conductive layer has an area-resistivity of up to about $10^{10}$ Ω/square.

Also, preferably, the resin has a volume-resistivity of up to about $10^{10}$ Ω·m. In the piezoelectric component, the back-surface conductive layer or the surface conductive layer is connected to a ground an external terminal of the mounting substrate.

According to the above-described structure, the generated electric charges are prevented from being discharged. Thus, a piezoelectric component is provided and has a piezoelectric element that is prevented from being broken by the discharge.

Moreover, according to another preferred embodiment of the present invention, a method of producing a surface acoustic wave device includes the steps of forming a plurality of surface acoustic wave elements including at least one interdigital electrode and a bump formed on the surface of a piezoelectric substrate, mounting the plurality of surface acoustic wave elements on a mounting substrate having external terminals via the bumps by flip chip bonding such that the at least one interdigital electrode is opposed to the mounting substrate, arranging a resin film on the mounting substrate having the plurality of surface acoustic wave elements mounted thereon, sealing the plurality of surface acoustic wave elements by embedding the resin film between adjacent surface acoustic wave elements mounted on the mounting substrate, hardening the resin film, and splitting the mounting substrate by dicing to form the individual surface acoustic wave devices.

Preferably, the sealing step is a hot-press bonding step in which the resin film is heated to be softened and simultaneously pressed by use of a jig.

According to this process for chip-size packaged surface acoustic wave devices (surface acoustic wave filters), the surface acoustic wave elements are mounted onto a mounting substrate having external terminals by flip chip bonding. The resin film is used to seal the surface acoustic wave elements. The resin film is heated and pressed to be deformed by use of a jig so that the surface acoustic wave elements are embedded (the resin film is filled between surface acoustic wave elements).

According to this process, a liquid resin is preferably not used, but the resin film is used to seal the surface acoustic wave elements. Therefore, the resin is prevented from flowing into the vibrating portion of a piezoelectric element. Thereby, it is unnecessary to provide a dam or other similar structure, and the size of the surface acoustic wave device is reduced. Moreover, because no liquid resin is used, generation of voids (holes, vanities or the like) is prevented. In the step of sealing the surface acoustic wave elements by the resin film, the heating and the pressing are simultaneously carried out by using a jig. Accordingly, this step is easily carried out compared to a process of bonding a resin film to a mounting substrate. The whole of the surface acoustic wave element is securely covered with the resin. Thus, the surface acoustic wave element is sufficiently protected. Accordingly, the surface acoustic wave device has a high reliability, is reduced in size, and is produced at a low production cost.

The method of producing a piezoelectric component, a piezoelectric component, and the method of producing a surface acoustic wave device are suitably used in the communication fields, e.g., for filters in communication devices such as portable telephones.

Other features, elements, steps, characteristics, and advantages of the present invention will become more apparent from the following detailed description of preferred embodiments of the present invention with reference to the attached drawings.

BRIEF DESCRIPTION OF THE DRAWINGS

FIG. 2 is a cross-sectional view illustrating the processes of producing the surface acoustic wave device according to the first preferred embodiment of the present invention;

FIG. 8 is a cross-sectional view illustrating a process of producing a surface acoustic wave device according to the second preferred embodiment of the present invention;

FIG. 11 is a cross-sectional view illustrating a process of producing a surface acoustic wave device according to the third preferred embodiment of the present invention;

DETAILED DESCRIPTION OF PREFERRED EMBODIMENTS

Hereinafter, the first preferred embodiment of the present invention will be described with reference to FIGS. 1 to 6 and FIG. 21 to FIG. 23.

Figure 1:
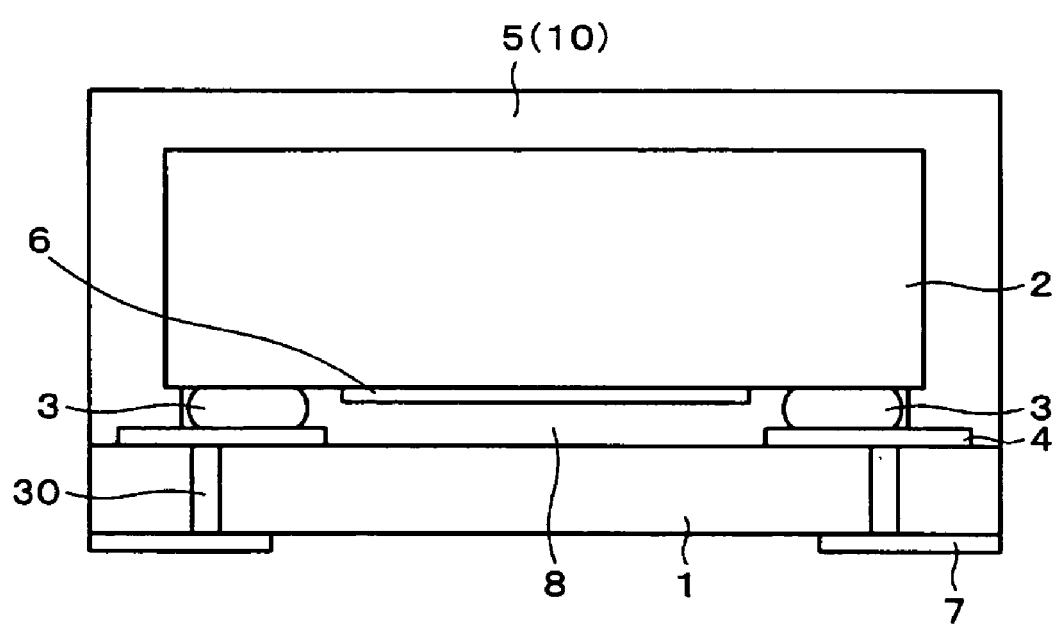
FIG. 1 is a cross-sectional view of a surface acoustic wave device according to the first preferred embodiment of the present invention.

FIG. 1 is a cross-sectional view of a surface acoustic wave device designed as a piezoelectric component according to this preferred embodiment of the present invention. The surface acoustic wave device of this preferred embodiment includes a mounting substrate 1 and a surface acoustic wave element (piezoelectric element) 2 mounted on the mounting substrate 1 by flip chip bonding. A mounting substrate 1 is preferably made of a ceramic, a resin, alumina, glass-epoxy, or other suitable material. The surface acoustic wave element 2 includes at least one interdigital electrode and a plurality of bumps disposed on a piezoelectric substrate. The surface of the surface acoustic wave element 2 on which the at least one interdigital electrode is provided is preferably used as a mounting surface.

The mounting substrate 1 and the surface acoustic wave element 2 are connected by bonding bumps 3 disposed on the surface acoustic wave element 2 and lands 4 provided on the mounting substrate 1. The mounting substrate 1 is provided with external electrodes 7 which are electrically connected to the lands 4 by via holes 30.

The at least one interdigital electrode is formed on the surface of the surface acoustic wave element 2 which is in opposition to the mounting substrate 1. The region of the surface acoustic wave element 2, in which the interdigital electrode is formed and a surface acoustic wave is propagated, is referred to as a functioning portion (vibrating portion).

The bumps 3 are preferably made of solder, gold, an electroconductive resin, or other suitable material. The bumps 3 may have a function of electrically connecting the surface acoustic wave element 2 to the mounting substrate 1, a function of mechanically fixing the surface acoustic wave element 2 to the mounting substrate 1, or a function of maintaining the mounting substrate 1 and the surface acoustic wave element 2 in separation from each other with a gap between them.

In the above-described surface acoustic wave device, the surface acoustic wave element 2 is covered and sealed with a sealing resin 5 (resin film 10). A gap (space) 8 is formed between the above-described functioning portion 6 and the mounting substrate 1, which allows a surface acoustic wave to be propagated.

Hereinafter, a method of producing a surface acoustic wave device according to the first preferred embodiment of the present invention will be described with reference to FIGS. 2 to 6.

The method of producing a surface acoustic wave device according to this preferred embodiment preferably includes processes 1 to 3 as shown in FIG. 2. In process 1, first, plural surface acoustic wave elements 2 are mounted on an assembly substrate 41 (mounting process). After the mounting process, the assembly substrate 41 is cut in the surface direction so that the mounting substrates 1 are formed. In particular, the bumps 3 formed on each surface acoustic wave element 2 are bonded to lands (not shown) formed on the assembly substrate 41. Thus, the surface acoustic wave elements 2 are mounted on the assembly substrate 41 by flip chip bonding. In this process, gaps (space) of at least about 10 μm are formed between the assembly substrate 41 and the surface acoustic wave elements 2 because of the bumps 3.

If the gaps are less than about 10 μm, the surface acoustic wave element 2 and the assembly substrate 41 have a high possibility of coming into contact with each other because of the warp, the surface-irregularities, and other deformations of the assembly substrate 41. When the surface acoustic wave element 2 and the assembly substrate 41 come into contact with each other, the characteristics of the produced surface acoustic wave device will be insufficient to be evaluated. For bonding the bumps 3 and the lands to each other, Au-Au bonding, soldering, plating bump bonding, hot press bonding, supersonic welding, and other suitable processes may be used. Moreover, for production of the surface acoustic wave element 2, at least one interdigital electrode and a plurality of bumps may be formed on a piezoelectric substrate.

Subsequently, the resin film (resin sheet) 10 is arranged on the surface acoustic wave elements 2 mounted on the assembly substrate 41 (arranging process). That is, the resin film 10 is arranged to cover the surface acoustic wave elements 2. Preferably, the resin film 10 is made from a material having a heat-softening property and an adhesive property, such as an epoxy resin composition, a polyimide type resin composition, and a polyolefin type resin composition. Most preferably, the film is made from an epoxy resin composition.

Preferably, the modulus of elasticity of the resin film 10 is in the range of about 0.05 MPa to about 2 MPa. If the resin film 10 is excessively flexible, the film has a greater possibility of adhering to the functioning portion. If the resin film 10 is excessively rigid, the resin cannot be embedded between the surface acoustic wave elements 2.

Then, the assembly substrate 41 having the resin film 10 placed thereon is passed between the two rollers (jigs) 11 set at a predetermined temperature and also a predetermined gap in advance so that the resin film 10 is hot-press-bonded to the assembly substrate 41 for sealing (sealing process).

While the resin film 10 is passed between the rollers 11 as described above, the resin film 10 is heated with the rollers 11 to be softened. Moreover, the resin film 10 is embedded around the peripheries of the surface acoustic wave elements 2. That is, the resin film 10 is embedded between the surface acoustic wave elements 2 so that the resin film 10 is hot-press bonded to the assembly substrate 41. Thus, the surface acoustic wave elements 2 are sealed on the inside of the sealing resin 5 of the resin film 10. The resin film may be supplied in a sheet form or in a continuous film form (roll-supply). A series of the processes described above is referred to as a laminating process.

Referring to the laminating process, the resin film 10 is heated to be softened where the resin film 10 behaves as a visco-elastic substance, not as an ordinary liquid. Therefore, the softened resin film 10 is made to intrude only in the vicinity of the end surfaces of the surface acoustic wave elements 2. Therefore, according to the laminating process, the resin is prevented from intruding into the gaps between the functioning portions of the surface acoustic wave elements 2 and the assembly substrate 41, in contrast to the case in which a liquid resin is used to seal the surface acoustic wave elements 2.

Figure 3A:
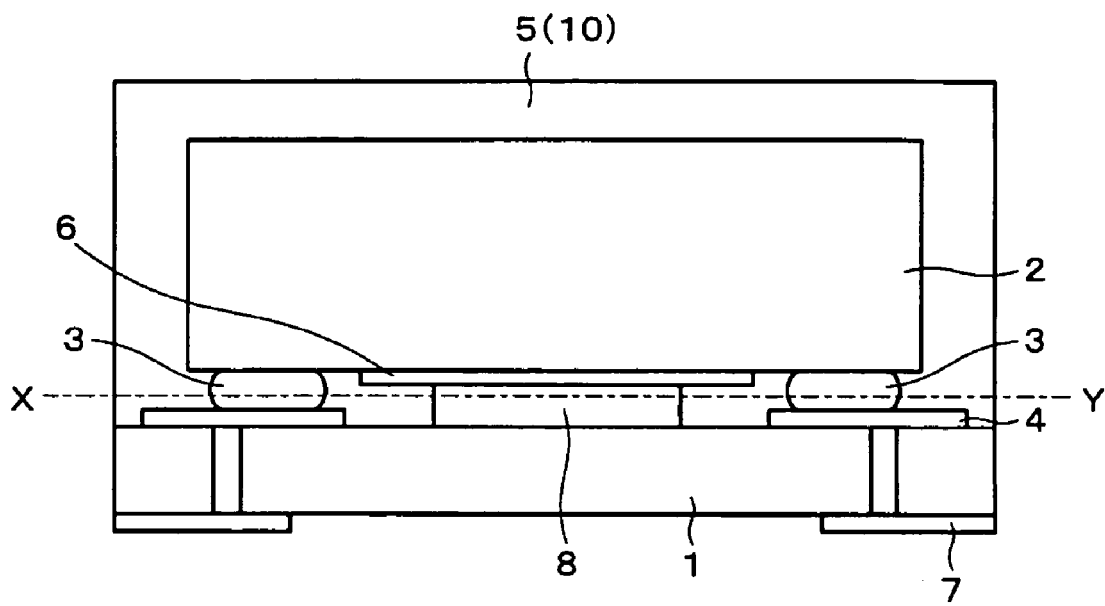
FIG. 3A is a cross-sectional view illustrating the state of the surface acoustic wave device in which resin-flowing-in rejection occurs.
Figure 3B:
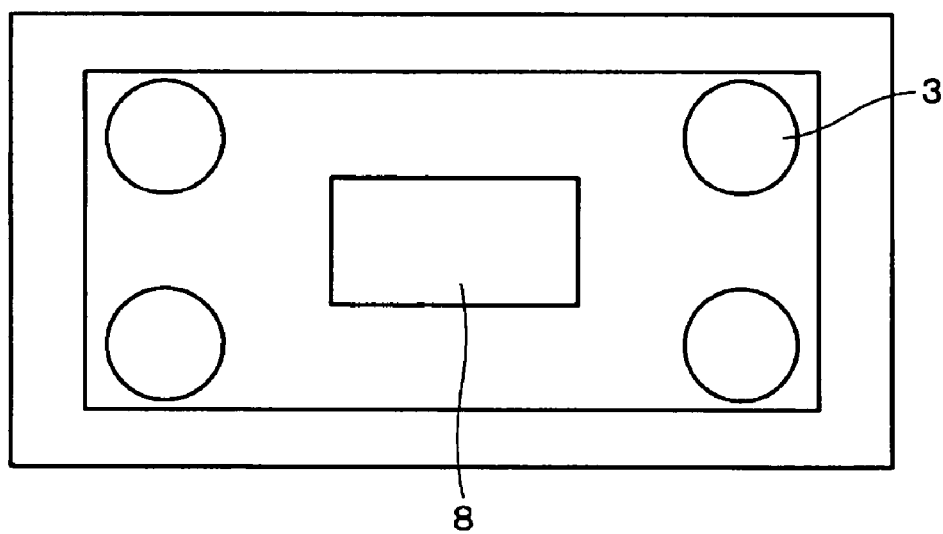
FIG. 3B is a cross-sectional view of the surface acoustic wave device taken along line X-Y in FIG. 3A.

If the resin intrudes into the gaps between the functioning portions of the surface acoustic wave elements 2 and the assembly substrate 41, the functioning portions are partially covered with the resin as shown in FIGS. 3A and 3B so that the function of the surface acoustic wave elements 2 is deteriorated. Thus, the produced surface acoustic wave devices may be rejected.

Figure 4:
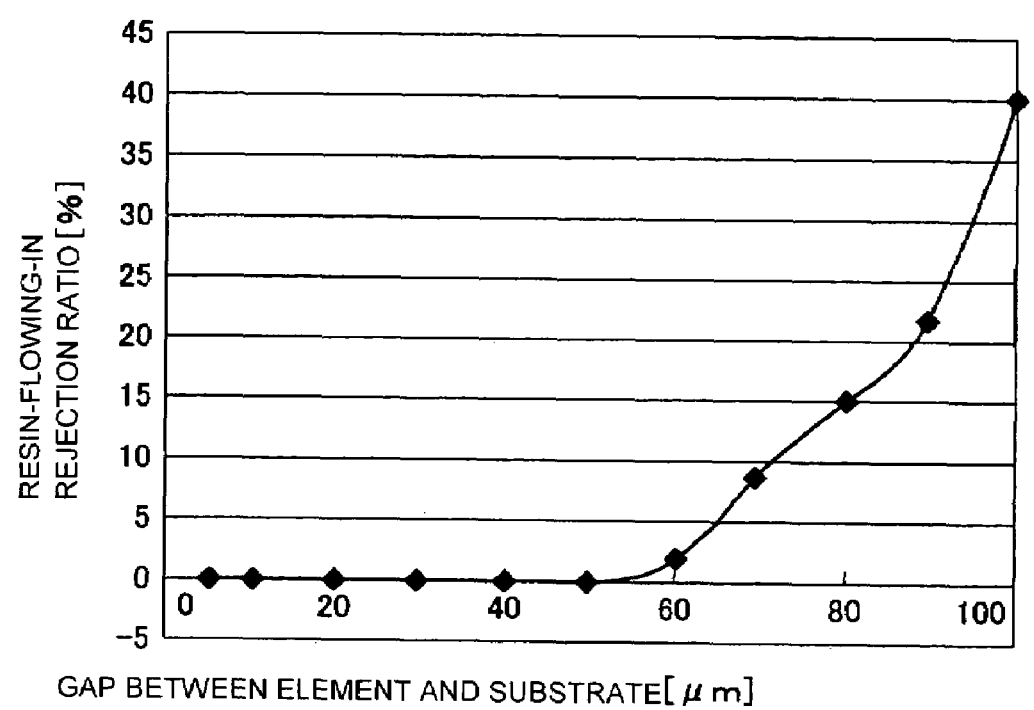
FIG. 4 is a graph illustrating a relationship of the gap between the surface acoustic wave element of the surface acoustic wave device and the mounting substrate to the resin-flowing-in rejection ratio.

The relationship of the size of the gaps between the surface acoustic wave elements 2 and the assembly substrate 41 to the resin-flowing-in rejection ratios was investigated. FIG. 4 shows the investigation results. As seen in FIG. 4, when the gaps between the surface acoustic wave elements 2 and the assembly substrate 41 are larger than about 50 μm, the softened resin film 10 has a higher possibility of intruding into the gaps. That is, the gaps between the surface acoustic wave elements 2 and the assembly substrate 41 have a size of up to about 50 μm. More preferably, the gaps have a size of up to about 40 μm. The above-described resin-flowing-in rejection means the state in which the resin intrudes into the gaps to adhere to the functioning portions of the surface acoustic wave elements 2, and the characteristics of the surface acoustic wave device are deteriorated.

In the laminating process, it is required to seal the surface acoustic wave elements 2 so that the sealing of the surface acoustic wave elements 2 can be also maintained after the cutting process which will be described below. Thus, it is necessary to embed the softened resin film 10 between the surface acoustic wave elements 2 with no formation of voids. If voids are generated, the adhesion between the resin film 10 and the assembly substrate 41 is reduced. Thus, the sealing of the surface acoustic wave elements 2 is maintained, and the produced surface acoustic wave deices will be rejected. That is, it is required to prevent the formation of voids, which may be generated by trapping of air present in the space between the resin film 10 and the assembly substrate 41 when the resin film 10 is placed on the assembly substrate 41.

The gaps between the surface acoustic wave elements 2 and the height (thickness) of the surface acoustic wave elements 2 including the heights of the bumps are important in preventing formation of voids. Similarly, the temperature (temperature of the rollers 11) at which the resin film 10 is softened and the pressure at which the resin film 10 is pressed into are also important. The height of the surface acoustic wave element 2 means the height thereof from the surface of the assembly substrate 41.

Figure 5:
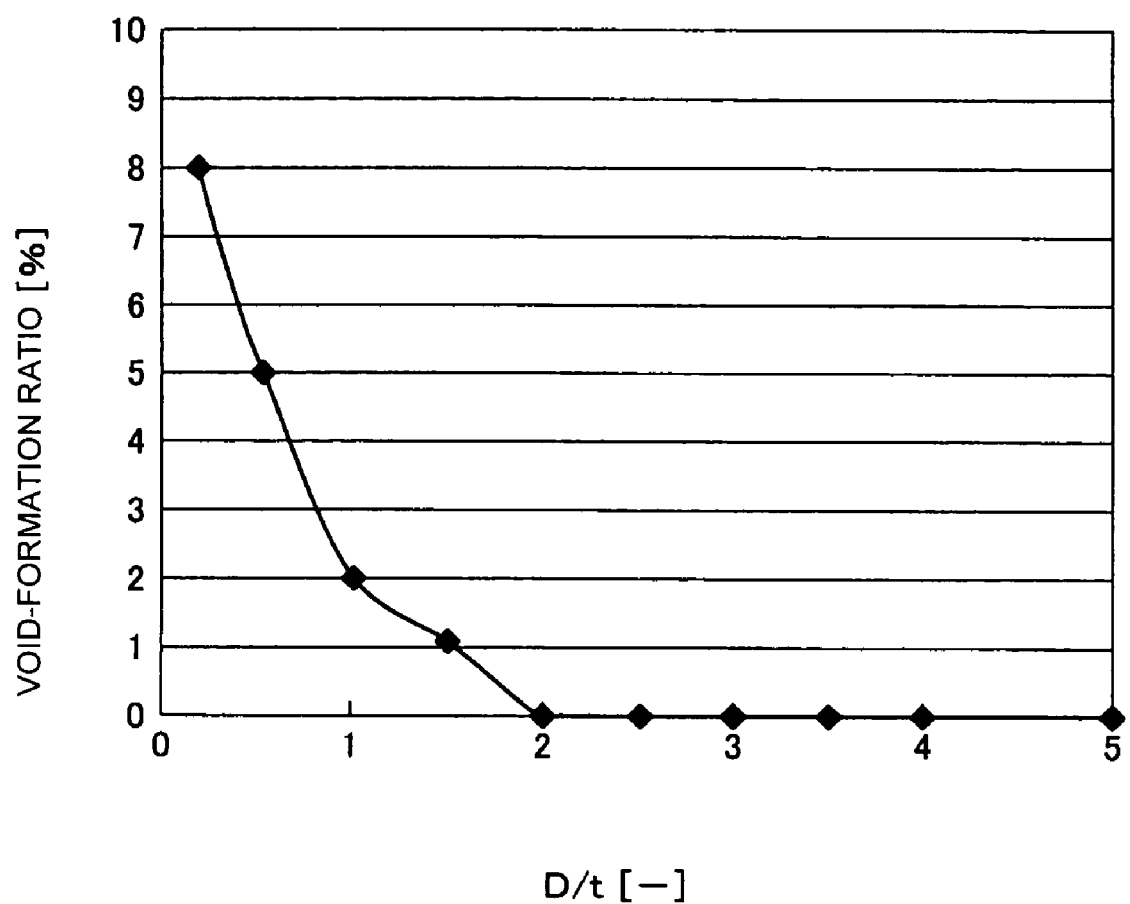
FIG. 5 is a graph illustrating a relationship of the ratio of the gap between the surface acoustic wave elements of the surface acoustic wave devices and the thickness of the surface acoustic wave elements to the void-formation ratio.

Effects of the gap (the intervals) D between the surface acoustic wave elements 2 and the height t (thickness) of the surface acoustic wave elements 2 involving the height of the bumps 3 on the intrusion of the resin were investigated. FIG. 5 shows the investigation results. FIG. 5 is a graph showing the void generation ratio versus D/t. The expression "void generation" means that voids are formed between surface acoustic wave elements causing the appearance to have remarkable deficiencies or means the voids cause the space under the surface acoustic wave element to be externally opened after the surface acoustic wave elements are cut (dicing) so that the sealing is insufficient. As seen in FIG. 5, it has been demonstrated that if the relationship of the interval D between surface acoustic wave elements to the height t of the surface acoustic wave elements satisfies the formula $D/t>2$, the filling of resin between the surface acoustic wave elements 2 is securely performed without generation of voids.

Figure 6:
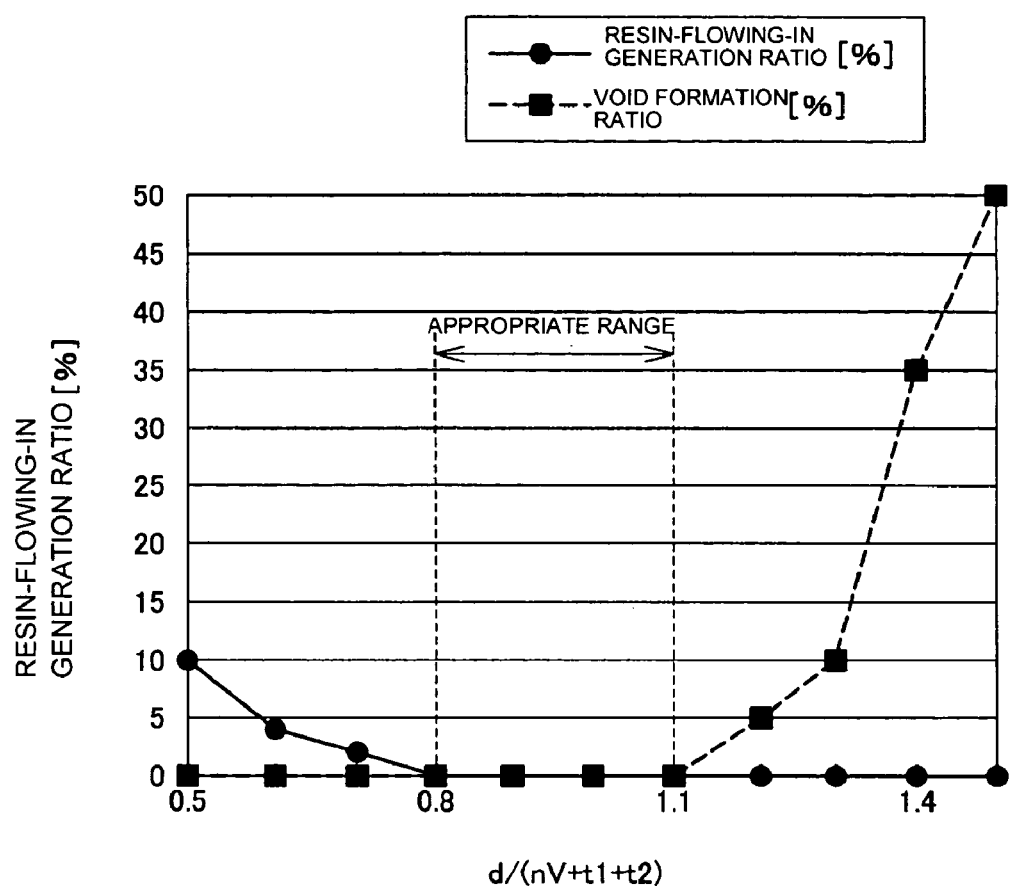
FIG. 6 is a graph illustrating a relationship of the design parameters to the resin flowing-in rejection ratio and the void-formation ratio.

Moreover, when the resin film 10 is used, the amount per unit area of the resin to be supplied is easily controlled. Relationships between design parameters, the resin-flowing-in rejection ratio, and the void generation ratio were investigated. As the design parameters, the thickness (height) d of a surface acoustic wave device (product), the volume V of the surface acoustic wave element 2 including the bumps 3 and the gap between the surface acoustic wave element 2 and the assembly substrate 41, the number n of surface acoustic wave elements per unit area on the assembly substrate 41, the thickness t1 of the resin film 10, and the average thickness t2 (cross-sectional area/length of assembly substrate) of the assembly substrate 41 are adopted. FIG. 6 shows the investigation results. FIG. 6 shows that, if the relationship expressed by the formula $0.8<d/(nV+t1+t2)<1.1$ is satisfied, then excess resin intruding into the gaps is prevented, and also, the sealing is performed without voids being formed in the vicinities of the surface acoustic wave elements. The above-described formula $d/(nV+t1+t2)$ represents the ratio of the thickness of a surface acoustic wave device to the sum of the average height and the thicknesses of the respective members. The nV represents the average height (thickness) of the surface acoustic wave elements 2 and is calculated assuming that the surface acoustic wave elements 2 have a uniform thickness in the whole of the assembly substrate 41.

In the laminating process, the pressure is applied to the resin film 10 because of a predetermined constant gap set between the rollers 11. The pressure is varied, depending on the feeding speed of the assembly substrate 41 caused by the rotation of the rollers 11, the thickness of the thickness of the resin film 10, and the above-described gap. The excess resin is spread in the transverse direction so as to flow out of the work-piece. Thus, the excess resin causes no problems.

If the feeding speed of the assembly substrate 41 is excessively high, sufficient adhesion strength between the assembly substrate 41 and the resin film 10 cannot be achieved. Thus, the lower limit of the feeding speed is preferably at least about 0.1 m/min. Also, preferably, the upper limit is up to about 0.5 m/min., more preferably, up to about 0.3 m/min.

The resin film 10 can be suitably softened by controlling the rotational speed of the rollers 11 so that the large load to the assembly substrate 41 and the surface acoustic wave elements 2 is reduced. Moreover, the thickness of the resin film 10 and the gap may be suitably adjusted so that an appropriate pressure is applied to the resin film 10. If the pressure is excessively high, the resin may intrude into the functioning portions of the surface acoustic wave elements 2, the bumps may be broken, and the surface acoustic wave elements 2 may be broken. Thus, the produced surface acoustic wave devices have a possibility of being rejected.

Moreover, the temperatures of the rollers 11 are required to be at values lower than the melting point of the resin film 10. If each temperature of the rollers 11 is higher than the melting point of the resin film 10, the resin film 10 becomes substantially liquid, and the fluidity is rapidly increased. This causes the resin flow into the functioning portions of the surface acoustic wave elements 2.

Moreover, the surface acoustic wave elements 2 have a pyroelectric property. Thus, if the temperature is rapidly increased, the electric charges of the surface acoustic wave elements 2 are accumulated and discharged so that the surface acoustic wave elements 2 may be broken. Therefore, the temperature must be increased with deliberation. Thus, preferably, the temperature has an upper limit of about 90° C. and a lower limit of about 30° C.

In the laminating process, the assembly substrate 41 is preferably passed through between the rollers 11 in which the passing-through starts from one end of the assembly substrate 41. Thereby, the air in the spaces defined by the resin film 10, the surface acoustic wave elements 2, and the assembly substrate 41 is pushed to be removed. Thus, the generation of voids is prevented.

After the laminating process, the resin film 10 is heat-treated at a predetermined temperature so that the resin is completely hardened as shown in process 2 (hardening process). Thereby, the resin film 10 is completely hardened to function as the sealing resin 5 as shown in FIG. 1.

In the heat-treatment, the air between the surface acoustic wave elements 2 and the assembly substrate 41 is expanded. According to the known techniques, voids are formed between the surface acoustic wave elements 2 in some cases. According to this preferred embodiment of the present invention, the size of the gaps between the surface acoustic wave elements 2 and the assembly substrate 41 are preferably set to be relatively small, that less than about 50 µm. Thus, the formation of voids is prevented.

As shown in process 3, the work-piece is cut by a cutting unit such as a dicer or other suitable device by a cutting-breaking method or other suitable method so that the surface acoustic wave devices are produced (splitting process). Thus, the surface acoustic wave device is produced by processes 1 to 3.

As described above, according to the method of producing a surface acoustic wave device according to this preferred embodiment of the present invention, the resin film 10 is heated to become a visco-elastic substance with which the surface acoustic wave element 2 is sealed. Therefore, the surface acoustic wave element 2 is sealed, and the adhesion of the resin to the functioning portion 6 of the surface acoustic wave element 2 is prevented. The sealing is hardly influenced by the warp of the assembly substrate 41 or by the conditions in which the surface acoustic wave elements 2 are mounted on the assembly substrate 41. Moreover, it is not necessary to provide dams or other suitable elements for preventing the resin from intruding between the surface acoustic wave elements 2 and the mounting substrates 1. Thus, the surface acoustic wave device is reduced in size.

Furthermore, because the resin film 10 is used, the resin can be applied in a constant amount in contrast to a liquid resin. Thereby, the surface acoustic wave device having stable qualities is produced.

Moreover, the size of the gaps between the surface acoustic wave elements 2 and the assembly substrate 41 is preferably less than about 50 µm. Thus, the amount of air existing between the surface acoustic wave elements 2 and the mounting substrate 1 is reduced. Therefore, the formation of voids, which may be caused when the resin is hardened, is inhibited.

Moreover, the temperature and the pressure are applied as required. Thus, pyroelectrically breaking of the surface acoustic wave elements 2, the deficient connection of bumps, and the breaking (chipping) of the surface acoustic wave elements 2 are prevented.

According to the above-described method of producing a surface acoustic wave device, the pressure applied between the rollers 11 is caused by the gap between the rollers 11. However, this method is not restrictive. A constant pressure may be applied in a manner which is different from the above-described method. If the pressure, caused by the gap, is excessively high, the surface acoustic wave elements 2 are broken. Thus, the pressure applied between the rollers 11 is preferably up to about 50 N. Moreover, only one of the rollers 11 may be heated.

Moreover, according to the above-described method of producing a surface acoustic wave device, the laminating process is carried out preferably by using two rollers 11. The laminating process may be carried out as follows: the assembly substrate 41 is placed on a flat stage, followed by the laminating process using a roller applied only from the resin film 10 side.

When the two rollers 11 are used, a load tends to be applied to the area of the assembly substrate 41 which is in contact with the roller 11. Especially, in the case in which a ceramic substrate is used as the assembly substrate 41, the assembly substrate 41 may be broken.

According to the above-described method, the assembly substrate 41 is placed on a flat stage. Therefore, the stress applied to the assembly substrate 41 is received by the stage. Thus, the stress is prohibited from being concentrated in a small area of the assembly substrate 41. The assembly substrate 41 is prevented from being broken.

As described above, the rollers are preferably used as jigs. This is not restrictive. Multi-stage rollers, belt rollers, and other suitable means may be used. Moreover, referring to the embedding using the rollers, rollers may be applied from the upper and lower sides. Alternately, a roller may be applied from the upper side while the stage is used on the lower side.

Figure 21:
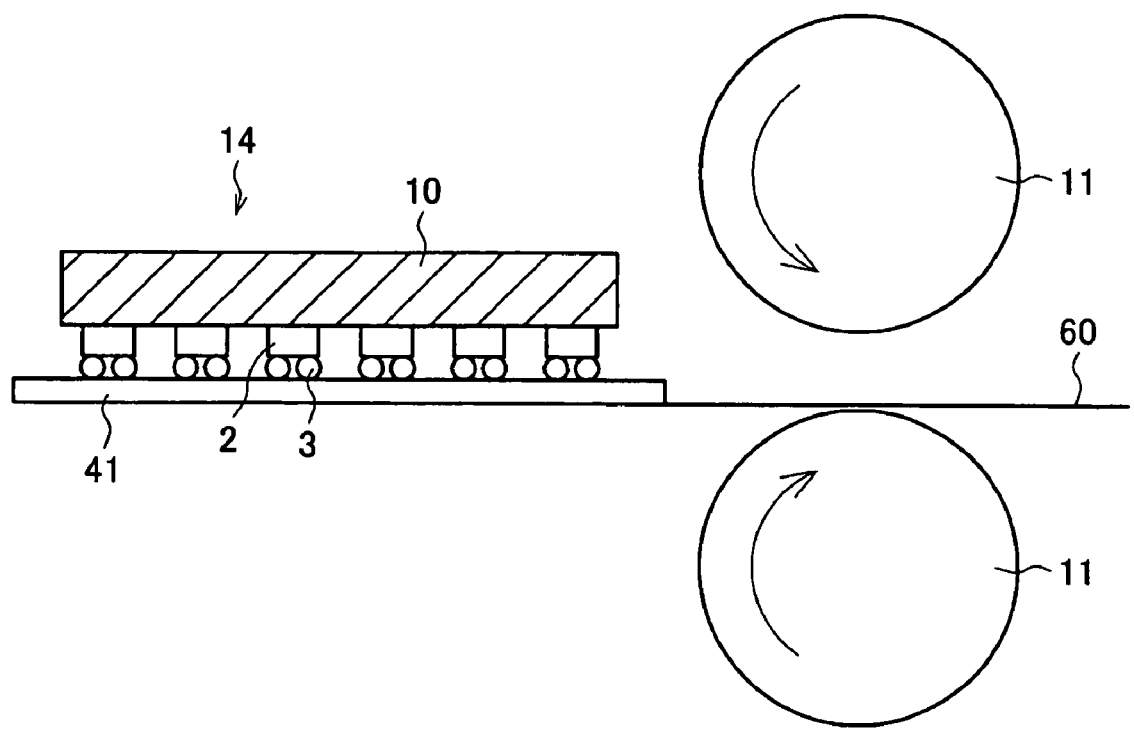
FIG. 21 is a front view illustrating a modification of a roller-process in the method of producing a surface acoustic wave device.

Moreover, referring to the method of producing a surface acoustic wave device of preferred embodiments of the present invention, the laminating process may be carried out as shown in FIG. 21. That is, a pre-laminate piece 14 is placed on a flat plate 60. In the pre-laminate piece 14, the resin film 10 is placed on the plurality of surface acoustic wave elements 2 mounted on the assembly substrate 41 via the bumps 3. The piece 14 together with the flat plate 30 are conveyed between the two rollers 11.

Moreover, according to the above-described method, the resin film 10 is embedded along the configurations of the surface acoustic wave elements 2. For embedding the resin film 10, any method may be used, provided that the resin can be embedded while the air in the peripheries of the surface acoustic wave elements 2 is pushed and removed to the outside.

Figure 22:
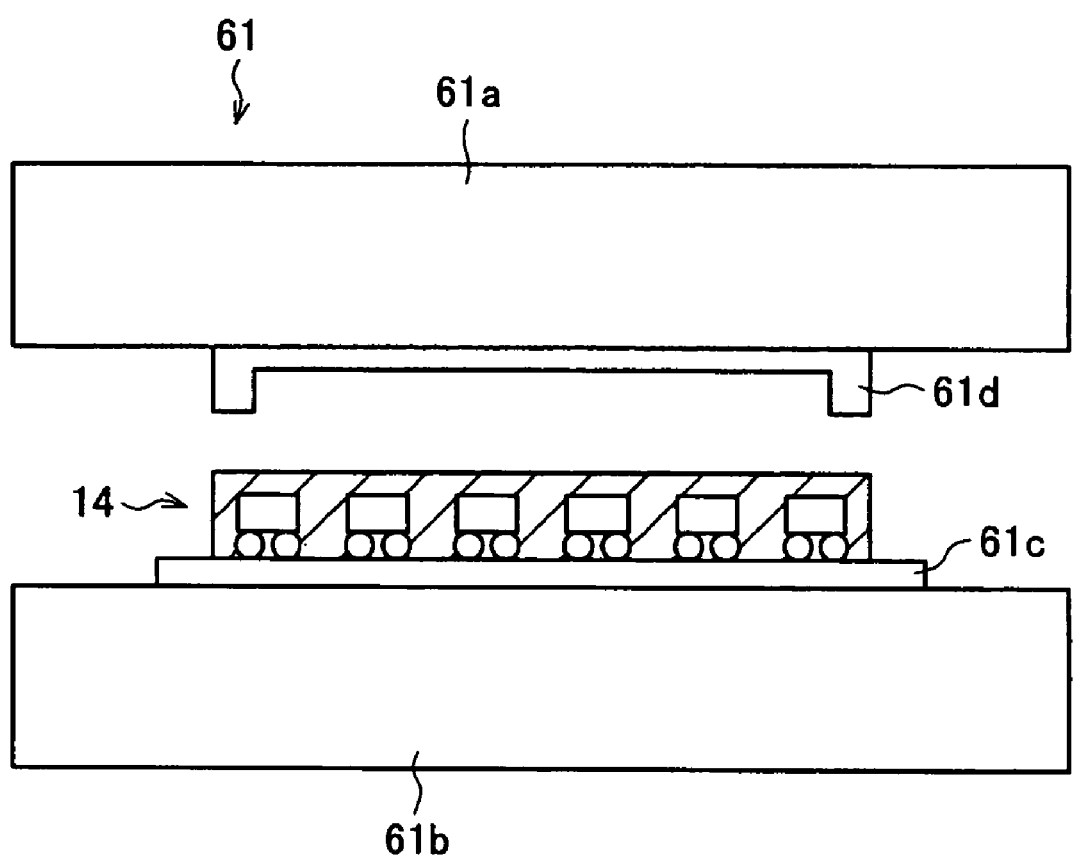
FIG. 22 is a front views illustrating a press-process in the method of producing the surface acoustic wave device.

For example, the following method may be used: as shown in FIG. 22, the pre-laminate piece 14 is placed on a stage 61c disposed on a lower side platform 61b in a press 61; and a jig, such as a press-frame 61d fixed to the lower side of the upper-side press 61a, presses the resin film 10 from the upper side thereof so that the resin film 10 is embedded. As described above, the use of the pressing process enhances the adhesion of the resin film 10 to the assembly substrate 41.

Referring to the method of pressing the resin film 10 by use of the press, when the pressing is simply carried out on a flat surface, adjacent surface acoustic wave elements 2, placed on the assembly substrate 41 and positioned on the inner side of the assembly substrate 41, function as walls which prevent the resin film 10 from spreading due to the air under the surface acoustic wave elements 2 and is thermally expanded. Thus, the generation of voids is prevented. On the contrary, no surface acoustic wave element, which function as walls, are provided on the sides of the surface acoustic wave elements 2 arranged in the outermost periphery of the assembly substrate 41. Therefore, the air under the surface acoustic wave elements 2 is thermally expanded, which causes large voids to be formed.

Accordingly, as the mold of the press 61, one having a frame 61d is preferably used. The outermost periphery of the work-piece is pressed by the frame 61, which functions as a wall, and pushes back the resin film 10 which is expanded due to the thermal expansion of the air. Thus, voids are prevented from being formed in the outermost periphery of the work-piece.

If the pressing force is excessively large, the resin film 10 of which the viscosity is decreased due the heat is forced to flow into the functioning portions 6 under the surface acoustic wave elements 2. Accordingly, the pressing force is set at a value at which the pressing force can counter the pressure caused by the thermal expansion of the air existing under the surface acoustic wave elements 2. The pressing force is determined by the press temperature. For example, when the press temperature is about 150° C., the pressing force is about 0.005 kgf/mm². Moreover, with the mold-frame 61d, the excess of the resin flows to the outside at pressing. Thus, the mold-frame 61d is effective in keeping constant the shapes of produced devices. In addition, the resin is hardened while it is pressed, and therefore, a sufficient adhesion is achieved. For this purpose, the mold-frame 61d may be provided in an integral convex mold or may be provided in a pressing surface of which the center portion is hollowed. The mold-frame 61d may be such that it is applied to directly press the resin film 10.

Figure 23A:
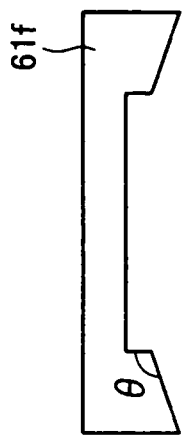
FIGS. 23A, 23B, and 23C illustrate mold-frames with different angles θ representing the tip-shapes of the mold-frames used in the press-process.
Figure 23B:
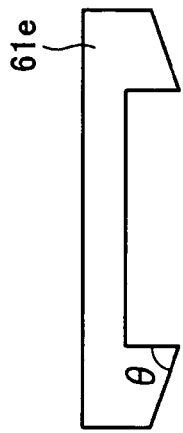
Figure 23C:
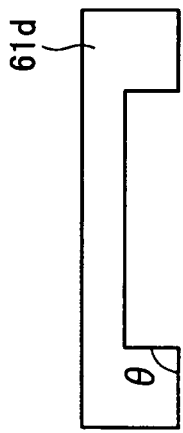

Referring to the shape and size of the tip of the mold-frame 61d, the angle θ of the inner-side end with respect to the opening of the mold-frame 61d (the angle θ between the tip-surface of the end with respect to the opening and the inner wall of the opening) are set at about 90° (FIG. 23A), to be less than about 90°, for example, at about 45° (FIG. 23B), and to be more than about 90°, for example, at about 135° (FIG. 23C). The above-described process was evaluated by use 50 of the mold-frames 61d to 61f. The number of formed voids in a produced surface acoustic wave device was determined. The pressing process was carried out in the same manner as that of the first preferred embodiment except for the shapes and sizes of the frames. For comparison, the pressing process was carried out without use of the mold-frame. The number of formed voids was determined. Table 1 shows the results.

TABLE 1

| Type of frame | Number of formed voids/evaluation-number | Determination | Remarks |
|---|---|---|---|
| Frame θ < 90° | 0/50 | Superior | θ = 45° |
| Frame θ = 90° | 1/50 | Superior | |
| Frame θ > 90° | 21/50 | Inferior | θ = 135° |
| No frame | 50/50 | Inferior | |

As seen in the results of Table 1, the angle θ is preferably set at a value not more than about 90°, as used in mold-frames 61d and 61e. That is, it is understood that by setting the angle θ at a value not more than about 90°, the advantages of the pressing process described in the first preferred embodiment are sufficiently obtained, the excess resin easily escapes in the pressing process using the mold-frame, and thus, the formation of voids is prevented.

According to the conventional techniques, sufficient sealing and fixing strengths are not obtained. According to preferred embodiments of the present invention, the embedding is carried out in the above-described roller process, and subsequently, the pressing process is carried out by use of a mold-frame of which the shape and the pressing-state can be finely adjusted. Thus, sufficient sealing and fixing strengths are obtained. As a result, the reliability is high, and the acceptance ratio is increased.

Moreover, as described above, the embedding is carried out in the roller process, and thereafter, the embedding is carried out in the laminating process. However, after the embedding is carried out in the pressing process, the embedding may be conducted in the roller process. In addition, after this roller-process, the embedding may be further carried out in the roller process.

Moreover, referring to the combination of the embedding in the roller-process and that in the press-process, the embedding in the press-process, that in the roller-process, and that in the press-process may be sequentially carried out. The embedding in the roller-process, that in the roller-process, and the press-process may be sequentially carried out.

When the resin film 10 is embedded by only one process, the assembly substrate may be broken if the pressure for embedding is high, or the embedding of the resin film 10 becomes in sufficient if the pressure for embedding is too small.

However, when the above-described combination of the roller-process and the press-process is used, the embedding is divided and carried out several times. First, the resin film 10 may be embedded to some degree, and then, the embedding can be finely adjusted. Thus, the embedding can be performed at high precision. Moreover, the surface acoustic wave elements 2 and the assembly substrate 41 are prevented from being damaged. The generation of the above-described inconveniences is prohibited.

Moreover, there is provided a process in which the resin film 10, after the embedding, is hardened with the shape of the resin film being maintained. When the resin is hardened, cautions should be taken against the formation of voids which may occur due to the thermal expansion of the air existing under the surface acoustic wave elements 2. As a method of preventing the formation of voids, preferably, the resin film is forcedly pressed and is cured while the formation of voids is prevented. As a method of pressing the resin film, the resin film may be fixed by a jig and placed directly in an oven to be cured. However, because it takes a lot of time to set the work-piece onto the jig, the work-piece may be pressed and hardened for a short time in the press-process, and, then sufficiently hardened in an oven (not pressed).

Hereinafter, the second preferred embodiment of the present invention will be described with reference to FIGS. 7 to 10. For convenient explanation, the members having the same functions as those described in the first preferred embodiment are designated by the same reference numerals, and the repeated description is omitted.

Figure 7:
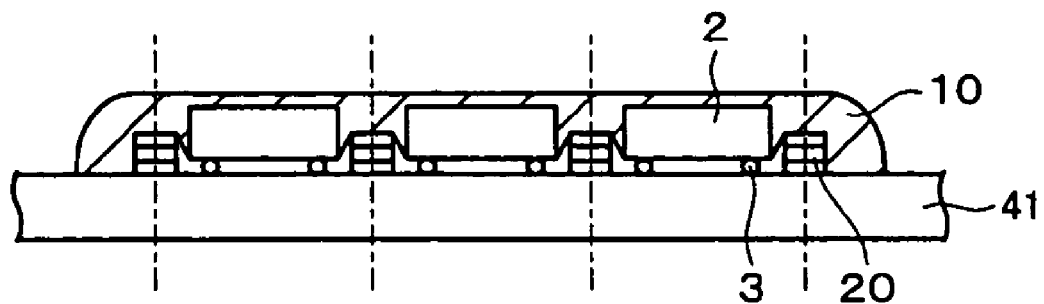
FIG. 7 is a cross-sectional view of a surface acoustic wave device, which is being processed, according to the second preferred embodiment of the present invention.
Figure 9:
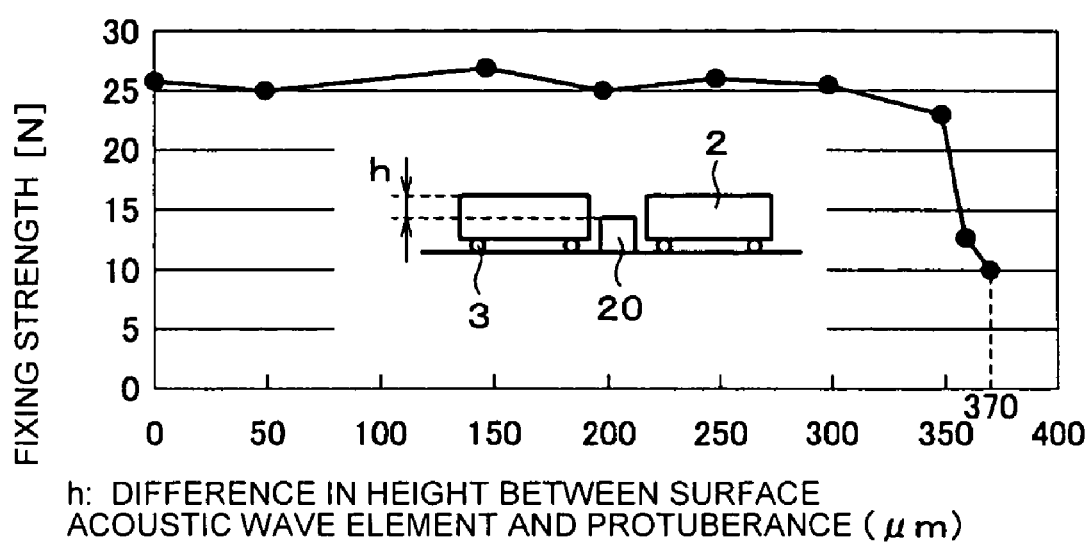
FIG. 9 is a graph illustrating a relationship between the height of the protuberances and the fixing strength of the resin film in the surface acoustic wave device.

According to this preferred embodiment of the present invention shown in FIG. 7, protuberances (sealing-assisting pieces) 20 are provided between the surface acoustic wave elements 2 mounted onto the assembly substrate 41. Protuberances 20 (sealing-assisting pieces) are provided to enhance the adhesion between the resin film and the surface acoustic wave elements 2 mounted on the assembly substrate 41 by flip-chip bonding.

Hereinafter, the method of producing the surface acoustic wave device according to this preferred embodiment will be described with reference to FIG. 8. According to the method of producing a surface acoustic wave device according to this preferred embodiment, a process of forming the protuberances 20 is added to process 1 in the first preferred embodiment. That is, the following processes 1a to 1c are used instead of process 1.

First, in process 1a, the protuberances 20 are formed between the positions of the assembly substrate 41 at which the surface acoustic wave elements 2 will be mounted. The protuberances 20 are preferably made of metals such as gold and aluminum, resins such as polyimide, epoxy or other suitable resins, or ceramic materials, for example. For the protuberances 20, materials having a high solid surface tension are preferred, considering the adhesion thereof to the resin film 10. Specifically, metals and ceramics are preferable. The method of forming the protuberances 20 has no particular limitation. Evaporation, sputtering, photolithography, and other suitable forming techniques are exemplified. Referring to the shapes of the protuberances 20, the areas of the protuberances 20 in which the protuberances 20 themselves are bonded to the resin film 10 are preferably as large as possible provided that the design permits them. That is, the protuberances 20 preferably have less tapered areas and large widths. The roughness of the protuberances 20 has no particular limitation. Preferably, the protuberances 20 are rather rough at the surface thereof considering the adhesion thereof to the resin film 10.

Subsequently, in process 1b, the surface acoustic wave elements 2 are mounted onto the mounting substrate by flip chip bonding.

Then, in process 1c, the resin film 10 is placed on the surface acoustic wave elements 2 and heat-pressed by jigs such as rollers or other suitable means to be embedded between the surface acoustic wave elements 2, as in process 1 of the first preferred embodiment.

Then, in process 2, the resin film 10 is hardened to function as a sealing resin. In process 3, the work-piece is cut into respective pieces by cutting-breaking or another appropriate method by means of a cutting device such as dicer or other suitable cutting elements. Thus, surface acoustic wave devices are produced.

According to the method of producing a surface acoustic wave device according to this preferred embodiment, the protuberances 20 are formed on the assembly substrate 41. Thus, to hot-press bond the resin film 10, it is not necessary to deflect the resin film 10 to a great degree. The gaps between the resin film 10 and the protuberances 20 are prohibited from being spread. Thus, the adhesion strength is enhanced. The resin film 10 can be made to adhere to the protuberances 20.

Thereby, the resin film 10 is fixed with high fixing strength. Thus, when the resin film 10 is hardened, the surface acoustic wave elements 2 are securely sealed.

Moreover, the protuberances 20 are provided for the assembly substrate 41. Thus, the protuberances 20 function as a barrier, which prevents the resin film 10, which is hardened and bled out, from intruding into the spaces under the surface acoustic wave elements 2. Moreover, routes in which water intrudes are reduced, which provides a structure having a high moisture-proof property. In addition, advantageously, the rigidity of the produced surface acoustic wave device is enhanced because of the protuberances 20. As a result, the reliability of the surface acoustic wave device is enhanced, and the acceptance ratio of the devices is high. It is to be noted that "bleed" means a phenomena in which a low molecular weight component (uncured component) contained in the resin film is oozed-out.

According to the above-described method, the protuberances 20 are formed before the surface acoustic wave elements 2 are mounted onto the assembly substrate 41. This is not restrictive. The protuberances 20 may be formed after the surface acoustic wave elements 2 are mounted onto the assembly substrate 41.

Moreover, in process 1c, the gaps between the protuberances 20 and the surface acoustic wave elements 2 are small. Thus, the resin intrudes between the protuberances 20 and the surface acoustic wave elements 2 with much difficulty. However, when the resin film 10 is closely contacted with the protuberances 20 for adhesion, sufficient adhesion strength between the resin film 10 and the protuberances 20 is attained. Therefore, the resin does not necessarily intrude between the protuberances 20 and the surface acoustic wave elements 2.

The relationship between the distance h, obtained by subtracting the height of the steps from the height (thickness) of the surface acoustic wave elements 2, and the fixing strength of the sealing resin, obtained by hot-press bonding the resin film 10 and hardening the resin, was determined. It has been revealed that the height of the protuberances 20 is preferably larger than the height of the bumps. Moreover, the height of the protuberances 20 is preferably smaller than the thickness of the surface acoustic wave elements 2, considering the feasibility of the dicing. In the relationship shown in FIG. 9, the height (thickness) of the surface acoustic wave elements 2 is preferably about 350 μm, and the height of the bumps is preferably about 20 μm. For the above-described fixing strength, a strength obtained by pressing the side surface of the sealing resin (resin film) is measured (shear strength test). In the case in which the protuberances 20 are high, the side surface of the sealing resin, of which the area is small, cannot be pushed. Thus, the top side of the sealing resin (the assembly substrate 41 side is lower) is fixed by means of an adhesive or the like. Then, the side surface of the protuberances 20 in the vicinities to the surface acoustic wave elements 2 is pushed for measurement of the fixing strength.

Moreover, as a modification of the method of forming the protuberances 20, in Process 1*a*, the protrusions may be formed by bonding a sheet having a plurality of openings onto the assembly substrate 41. That is, the sheet functions as the protuberances. Thus, the protuberances 20 can be easily formed. The surface acoustic wave elements are mounted through the openings, respectively. Then, the resin film 10 is hot-press bonded, cured, and diced. Thus, a surface acoustic wave device is produced. The sheet may be bonded before or after the surface acoustic wave elements 2 are mounted onto the assembly substrate 41.

Figure 10:
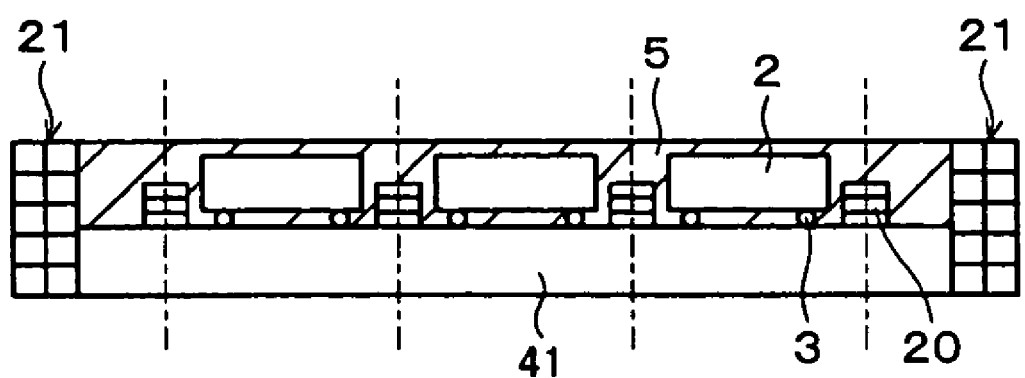
FIG. 10 is a cross-sectional view illustrating a the process of producing the surface acoustic wave device according to the second preferred embodiment of the present invention.
Figure 12:
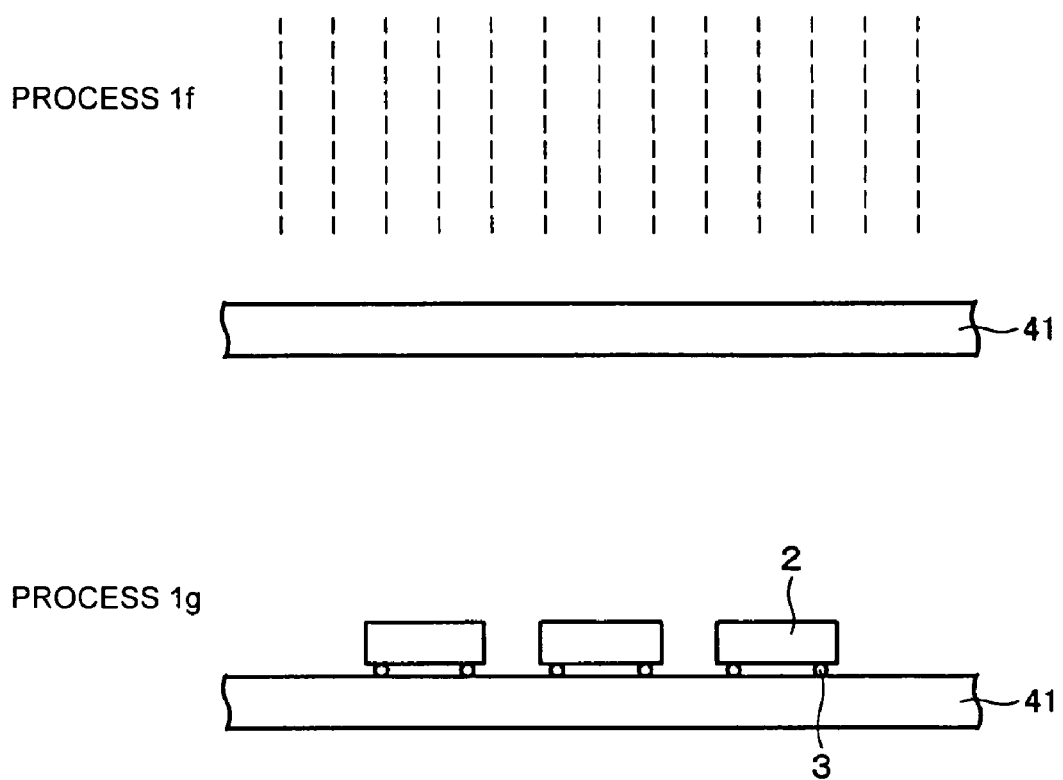
FIG. 12 is a cross-sectional view illustrating the process of producing the surface acoustic wave device according to the third preferred embodiment of the present invention.

Moreover, as shown in FIG. 10, an outer frame 21 may be provided in the periphery of the assembly substrate 41 before the resin film 10 is hot-press bonded to the assembly substrate 41, or the assembly substrate 41 may be set onto the outer frame 21. When the resin film 10 is hot-press bonded to the assembly substrate 41 by rollers, the outer frame 21 prevents the resin film 10 from flowing out (being bleeding out). Therefore, the resin can be uniformly supplied onto the assembly substrate 41. Thereby, a surface acoustic wave device having less defects in the appearance is provided. Preferably, the outer frame 21 is coated with a surface-smooth film made of a material from which the resin stuck thereto can be easily peeled off from the assembly substrate 41 after the resin film 10 is hot-press bonded. The material is preferably a fluoro-resin such as polytetrafluoroethylene or other similar material.

Hereinafter, the third preferred embodiment of the present invention will be described with reference to FIGS. 11 to 15. For convenient explanation, the members having the same functions as those of the first and second preferred embodiments are designated by the same reference numerals. The repeated description is omitted.

The method of producing a surface acoustic wave device according to this preferred embodiment is the same as that of the first or second preferred embodiments except that the assembly substrate 41 is surface-modification-treated before or after the surface acoustic wave elements 2 are mounted onto the assembly substrate 41. Thereby, the adhesion of the resin film 10 to the assembly substrate 41 is enhanced. Thus, a sufficient fixing strength between the assembly substrate 41 and the resin film 10 is obtained. Accordingly, the reliability of the surface acoustic wave device is high, and the acceptance ratio is high. Moreover, even if the area in which the assembly substrate 41 and the resin film 10 are in contact with each other is reduced, a sufficient fixing strength is attained. Thus, a surface acoustic wave device having a greatly reduced size is provided.

As the surface modification treatment, for example, plasma-processing, UV processing, corona-discharge processing, excimer-laser processing, or other suitable process may be used. Advantageously, stains on the surface of the assembly substrate 41 can be removed therefrom, which facilitates the fixing of the resin film 10. The surface of the assembly substrate 41 is roughened to have concavities and convexities, which facilitates the fixing. The number of OH groups at the surface, which are effective in high fixing strength, can be increased, which facilitates the fixing. Moreover, the time required for the surface modification treatment is short, e.g., several seconds.

Hereinafter, the surface modification treatment will be described with reference to FIG. 11 where the surface of the assembly substrate 41 is modified by plasma-processing after the surface acoustic wave elements 2 are mounted onto the assembly substrate 41. The method of this preferred embodiment is preferably the same as that in the first preferred embodiment except that process 1*d* and process 1*e* are used instead of process 1 in the first preferred embodiment.

First, in process 1*d*, the surface acoustic wave elements 2 are mounted onto the assembly substrate 41 by flip chip bonding. The surface of the assembly substrate 41 onto which the surface acoustic wave elements 2 are mounted is processed by plasma 40.

Subsequently, in process 1*e*, the resin film 10 is arranged. Then, in process 2, the resin film 10 is press-bonded to the assembly substrate 41 by jigs such as rollers or other suitable devices. Then, in process 3, the resin film 10 is cured and diced. Thus, a surface acoustic wave device is produced.

Figure 13:
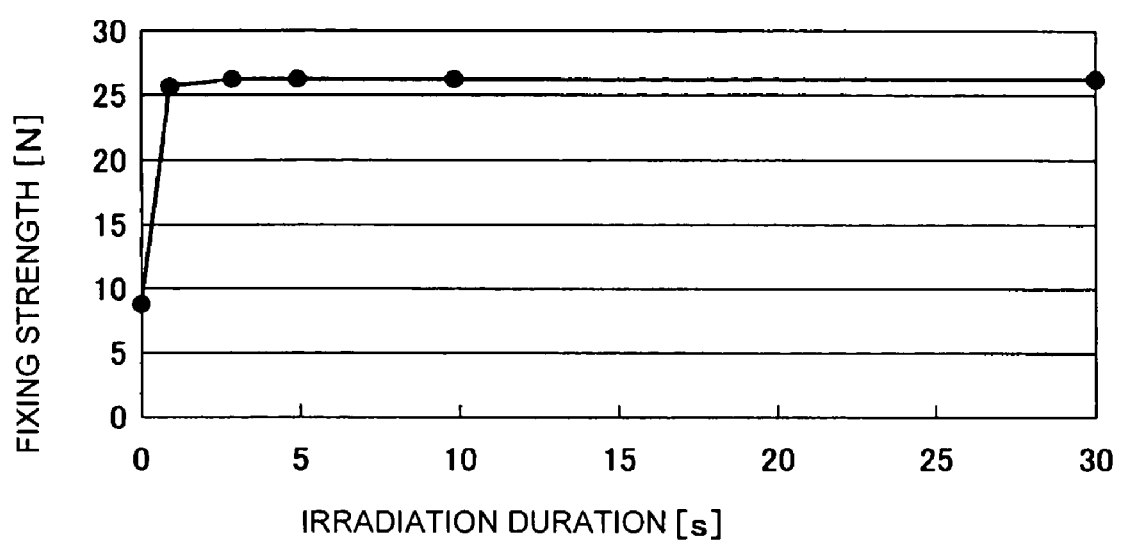
FIG. 13 is a graph illustrating a relationship between the plasma irradiation duration in the production process of FIG. 11 and the fixing strength.
Figure 14:
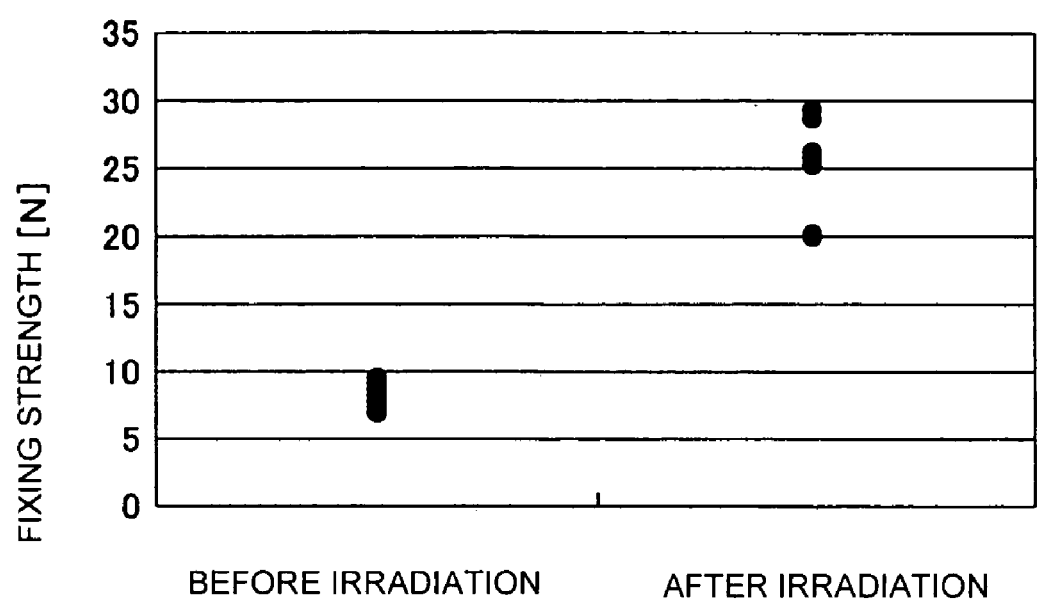
FIG. 14 is a graph illustrating, for comparison, the fixing strengths obtained when the plasma processing is carried out and when the processing is not carried out.

FIG. 13 is a graph illustrating a relationship between the irradiation duration of the plasma 40 and the strength at which the assembly substrate 41 and the resin film 10 are fixed. FIG. 14 compares the fixing strengths obtained when the assembly substrate 41 is plasma-processed and when the substrate 41 is not plasma-processed. FIGS. 13 and 14 show that the surface-treatment of the assembly substrate 41 using the plasma 40 enhances the fixing strength.

Figure 15:
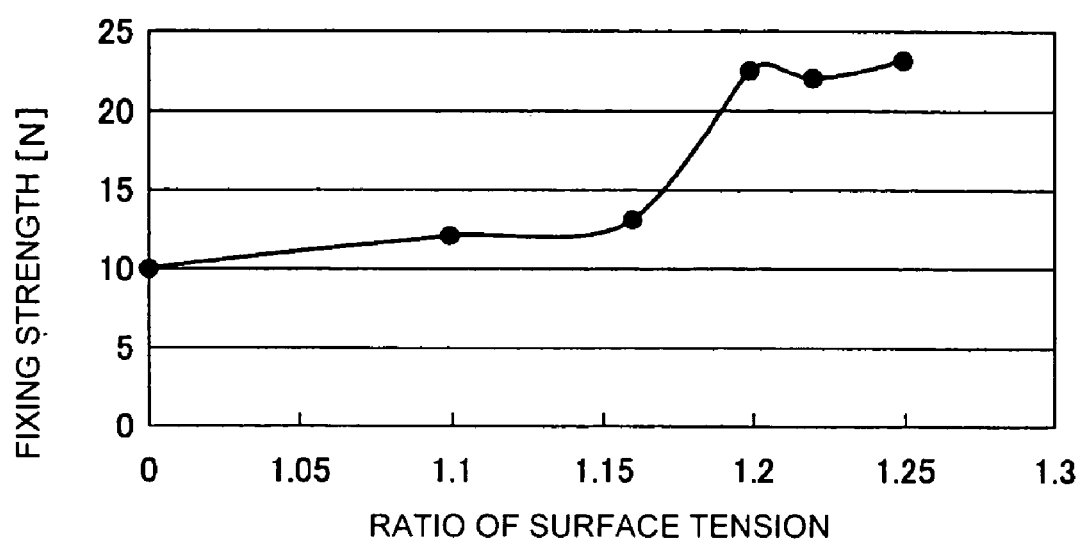
FIG. 15 is a graph illustrating the change of the fixing strength with the surface tension of the solid on the mounting substrate.

Moreover, the solid surface tension of the assembly substrate 41 can be used as an index representing the fixing strength. As shown in FIG. 15, when the surface tension of this solid after the surface-modification-treatment is about 1.2 times of that before the surface-modification-treatment, the fixing strength is enhanced. That is, it is preferably that the surface tension of the solid after the surface-modification-treatment is about 1.2 times of that before the treatment.

A modification of the method of producing a surface acoustic wave device of this preferred embodiment includes process 1*f* in which the surface-modification-treatment is carried out before the surface acoustic wave elements 2 are mounted onto the assembly substrate 41 and process 1*g* in which the surface acoustic wave elements 2 are mounted onto the mounting substrate after the surface-modification-treatment, instead of the above-described Process 1*d*.

According to this modification, the assembly substrate 41 can be sand-blast-processed and primer-treated, in addition to the above-described treatment, because the assembly substrate 41 has no surface acoustic wave elements 2 mounted thereon. That is, the surface acoustic wave elements 2 are not broken. Thereby, the mounting strength between the surface acoustic wave elements 2 and the assembly substrate 41 (bonding of the bumps of the substrate) is enhanced.

In the above-described preferred embodiments, the assembly substrate 41 is used for enhancement of production efficiency. One surface acoustic wave element 2 may be mounted onto the mounting substrate 1, and the surface acoustic wave element 2 is sealed with the resin film 10.

Hereinafter, the fourth preferred embodiment of the present invention will be described with reference to FIGS. 16 to FIG. 20. For convenient explanation, the members having the same functions as those described in the first preferred embodiment are designated by the same reference numerals. The repeated description is omitted.

The surface acoustic wave device suffers from rapid change of temperature when the device is heat-shock tested and the re-flowing is carried out. In the surface acoustic wave elements of the surface acoustic wave device, electric charges are generated due to the pyroelectric properties of the piezoelectric substrates of the surface acoustic wave elements, when the temperature is changed as described above. With the generation of the electric charges, discharge may occur in the interdigital electrodes of the surface acoustic wave elements. As a result, the surface acoustic wave elements may be broken. In the HS test, a product is made to repeatedly go back and forth between two ovens having different temperatures in a predetermined time so that heat shock is applied to the product. For example, the device is made to repeatedly go back and forth between ovens having temperatures of about −55° C. and about 85° C. at intervals of 30 minutes. This HS test is required by substantially all of the specifications of users.

Figure 16:
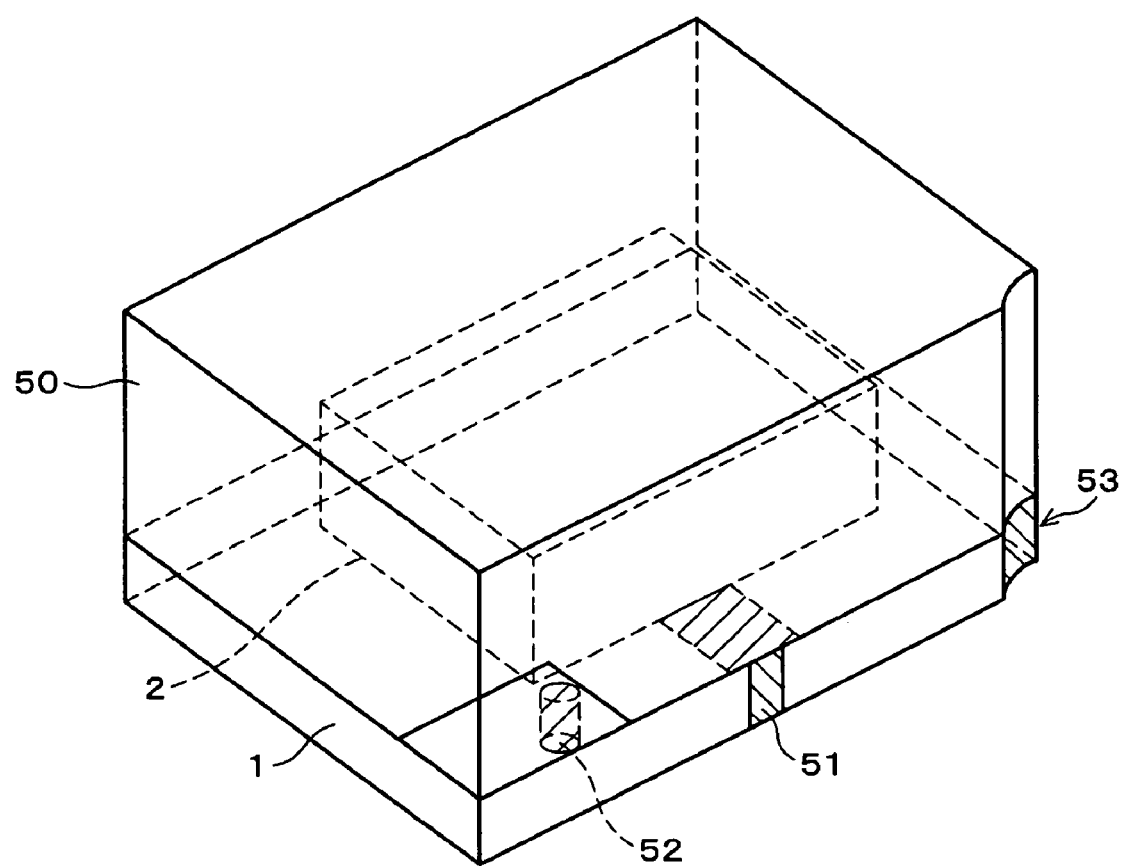
FIG. 16 is a cross-sectional view of a surface acoustic wave device according to the fourth preferred embodiment of the present invention.

Thus, in this preferred embodiment, as shown in FIG. 16, a resin film having an electro-conductivity (electroconductive resin film) is used to form a sealing resin 50 instead of the resin film used in the arranging process in the first preferred embodiment.

Figure 17:
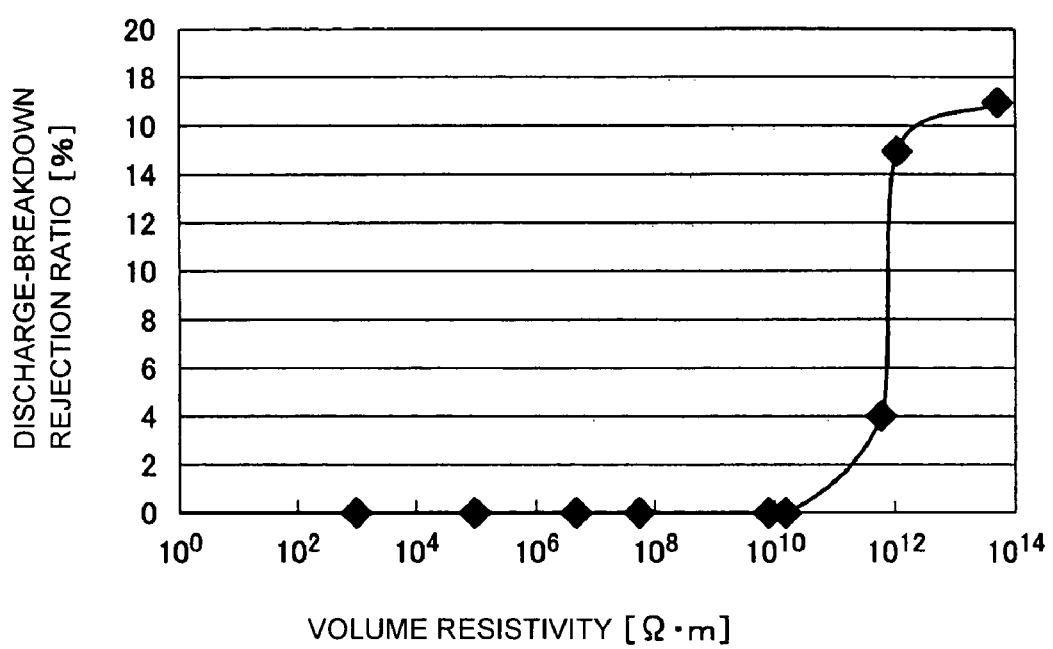
FIG. 17 is a graph illustrating a relationship between the volume resistivity of the resin film and the discharge-breakdown rejection ratio of the surface acoustic wave element in the surface acoustic wave device.

Moreover, investigation was performed for the rejection ratios (discharge-breakdown rejection ratios) of surface acoustic wave devices caused by the discharge-breakdown of the surface acoustic wave elements in the produced surface acoustic wave devices depending on the volume-resistivities of the conductive resin films. FIG. 17 is a graph showing the investigation results. As seen in the graph, the volume resistivity as the characteristic of the electroconductive resin film is preferably up to about $10^{10}$ Ω·m. For determination of the above-described discharge-breakdown, after an abnormal value in the characteristic of a surface acoustic wave device is found (a ripple is generated in the waveform), the surface acoustic wave device is dissembled, and it is confirmed whether the thin-film electrode (interdigital electrode) formed on the surface acoustic wave element is partially broken or not (a portion of the thin-film electrode is burnt out by the spark generated during discharging).

According to the above-described arrangement, the electric charges generated on the piezoelectric substrates of the surface acoustic wave elements can be migrated onto the resin film so that the electric charges can be neutralized (escaped). For this reason, in the surface acoustic wave device produced according to this method of this preferred embodiment, the above-described discharge is prevented, and thus, the breaking of the surface acoustic wave elements is avoided.

For example, the electroconductive resin film may be formed as follows: a sheeting agent (thermoplastic resin) and an inorganic filler (silica gel and glass balloons) are added to an epoxy resin composition, electroconductive carbon black is added in an amount of about 3% to about 7%, and the composition is kneaded and rolled to be formed into a sheet having a thickness of about 200 µm to about 500 µm. Moreover, the conductive sheet may be formed by adding about 3% to about 7% of conductive carbon black to a thermosetting polyimide and forming it into a sheet having a thickness of about 200 µm to about 500 µm.

That is, the conductive resin film may be formed by forming a resin composition containing a base resin compounded with a conductive resin and a conductive material into a film. As the base resin, materials having heat-softening properties and adhesive properties may be used. For example, a composition including at least one resin selected from epoxy type resins, polyimide type resins, polyolefin resin, phenol resin and silicone resins may be used.

As the conductive resin, at least one resin selected from polypyrrole, polythiophene type resins, polyacetylene type resins, polyaniline type resins, polyphenylenevinylene type resins, and other suitable resins may be used.

As the conductive material, at least one conductive material selected from carbon black, and metal powders of Ag, Au, Ni, and other suitable metals may be used. Carbon black is especially preferable as the conductive material.

Moreover, preferably, the conductive resin film, after it is hardened on the surface acoustic wave elements 2, is connected to a ground terminal (not shown) of the mounting substrate 1. Thereby, electric charges generated on the surface acoustic wave elements 2 more effectively escape to the ground terminal. For example, the ground terminal may be formed on the surface (back side) of the mounting substrate 1 on which the surface acoustic wave elements 2 are not mounted. As shown in FIG. 16, a side surface electrode 51 formed on the side of the mounting substrate 1m, a via-hole 52 formed in the mounting substrate 1, or a through-hole 53 may be used for connecting the sealing resin 50 formed of the conductive resin film to the ground terminal.

Figure 18:
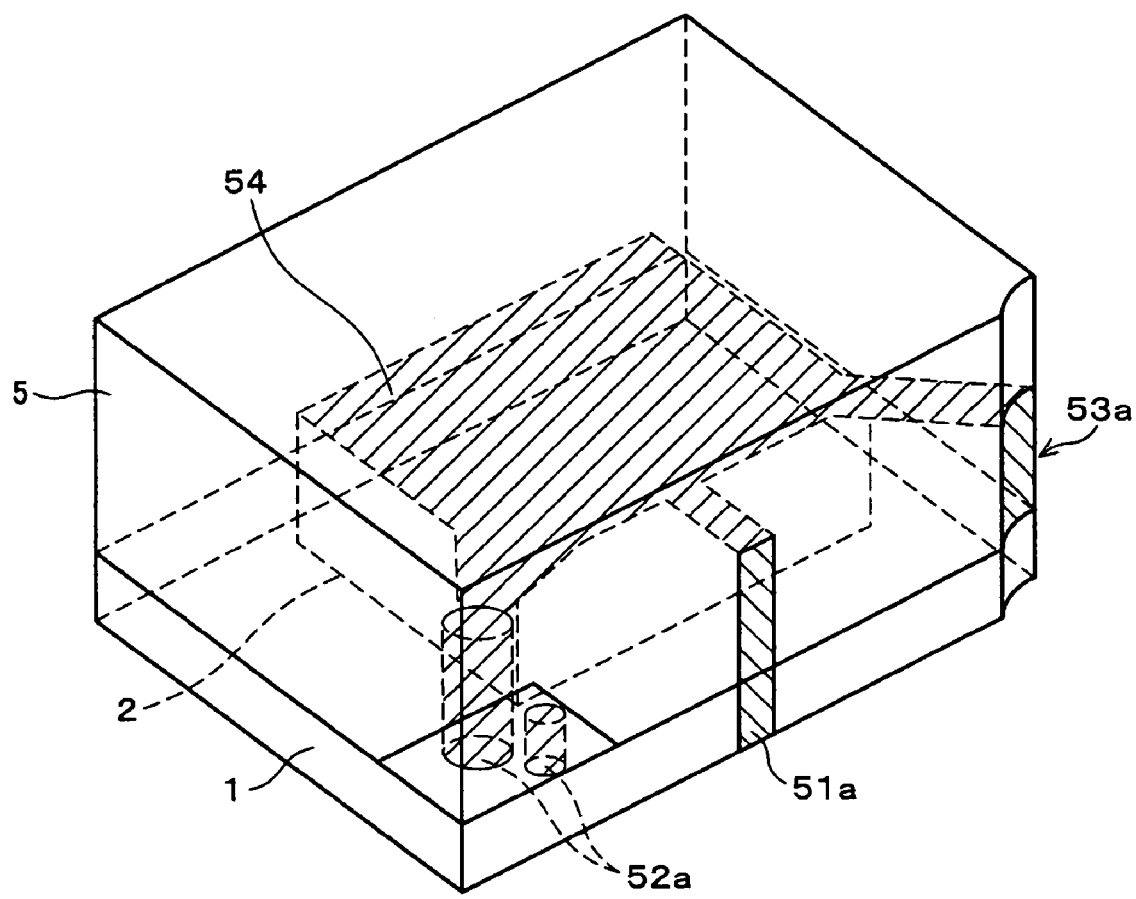
FIG. 18 is a cross-sectional view illustrating a modification of the surface acoustic wave device of FIG. 16.

Moreover, as shown in FIG. 18, to form a conductive layer (back-side conductive layer) 54, the top surface (the surface thereof on the side opposite to the mounting surface of the surface acoustic wave element 2) of the surface acoustic wave element 2 in the package may be metallized instead of using a conductive resin film as the resin film (back-side conductive layer forming process). The metallizing may be performed by a dry plating process such as sputtering, evaporation, or other suitable process, and wet-plating process using an electrolytic solution, or coating (printing) with a conductive resin, conductive paste or other suitable process.

As the material for use in the above-described metallizing, for example, Au, Ag, Al, Ni, Ti, Cu, Cr, $In_2O_3$, ZnO, and other suitable metals may be used. Preferably, the conductive layer 54 is formed after the mounting process described in the first preferred embodiment. Also, preferably, the conductive layer 54 is connected to a ground terminal similarly to the sealing resin 50. A side surface electrode 51a formed on one side surface of the mounting substrate 1, a via-hole 52a formed in the mounting substrate 1 and the sealing resin 5, a through-hole 53a formed in the mounting substrate 1, or other similar element may be provided for connection of the conductive layer 54 to the ground terminal, similar to the sealing resin 50 using the conductive resin film.

According to the above-described structure, the conductive layer 54 is connected directly to the piezoelectric substrate of a surface acoustic wave element 2 on which electric charges are generated. Thus, the antistatic effects are high. Electric charges generated on the surface acoustic wave element 2 are rapidly neutralized by the conductive layer 54, and thus, the discharge-breakdown is prevented. Moreover, the connection of the conductive layer 54 to the ground terminal ensures the discharge-breakdown preventing effects. Moreover, only the top surface of the surface acoustic wave element 2 is metallized. The metallized area is small, which is advantageous in the reduction of the production cost. The conductive layer 54 is covered with the sealing resin 5. Thus, the conductive layer 54 is prevented from being exposed to the top surface of the package on which letters are to be printed. Therefore, the color and materials for the conductive layer 54 have no limitation.

Figure 19:
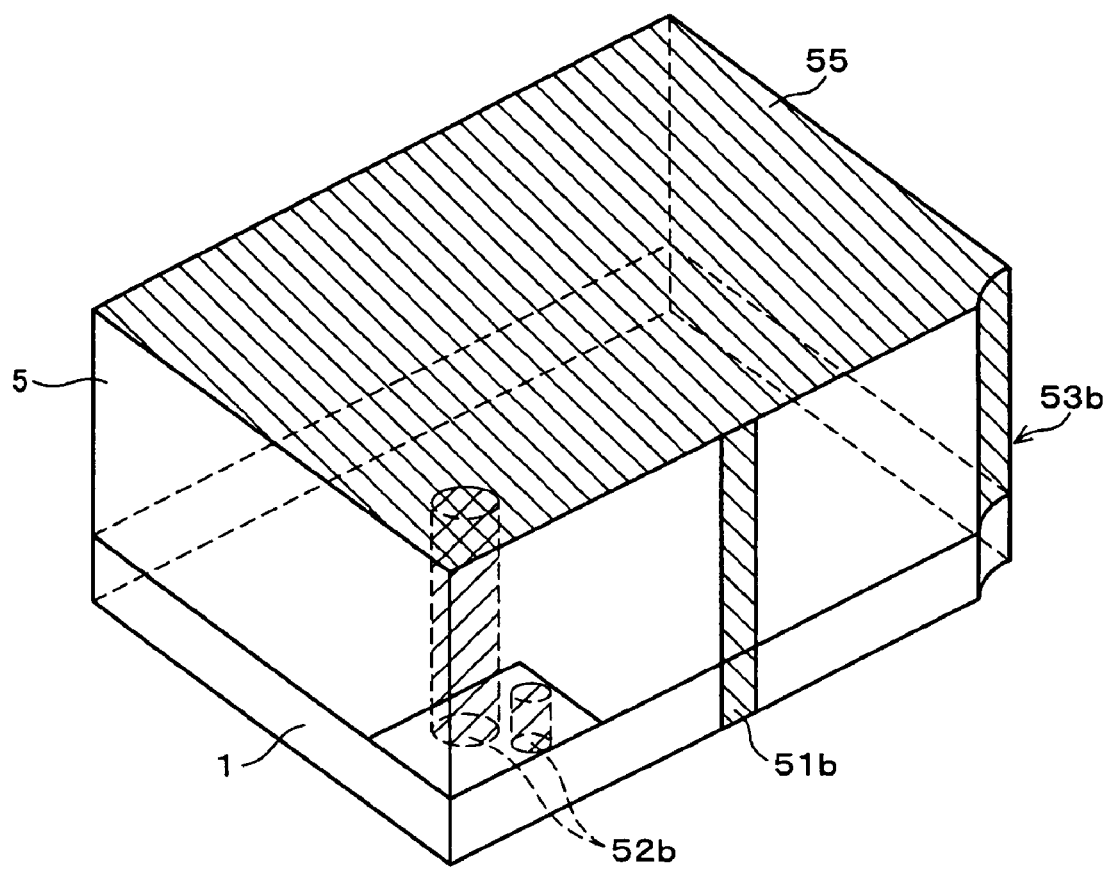
FIG. 19 is a cross-sectional view of another modification of the surface acoustic wave device of FIG. 16.

Moreover, as shown in FIG. 19, the top-surface (the surface of the resin) of the sealing resin 5 may be metallized to form a conductive layer (surface conductive layer) 55, instead of the conductive layer 54 formed on the back-side surface of the surface acoustic wave element 2.

Preferably, the conductive layer 55 is connected to a ground terminal similarly to the sealing resin 50. A side surface electrode 51b is formed on an side surface of the mounting substrate 1, a via-hole 52b is formed in the mounting substrate 1 and the sealing resin 5, or a through-hole 53b is formed in the mounting substrate 1 to connect the conductive layer 55 to the ground terminal, similar to the sealing resin 50 using the conductive resin film. The conductive layer 55 neutralizes electric charges generated on the surface acoustic wave element 2 so that the discharge-breakdown is prevented. Moreover, the connection of the conductive layer 55 to the ground terminal ensures the discharge-breakdown preventing effects.

Figure 20:
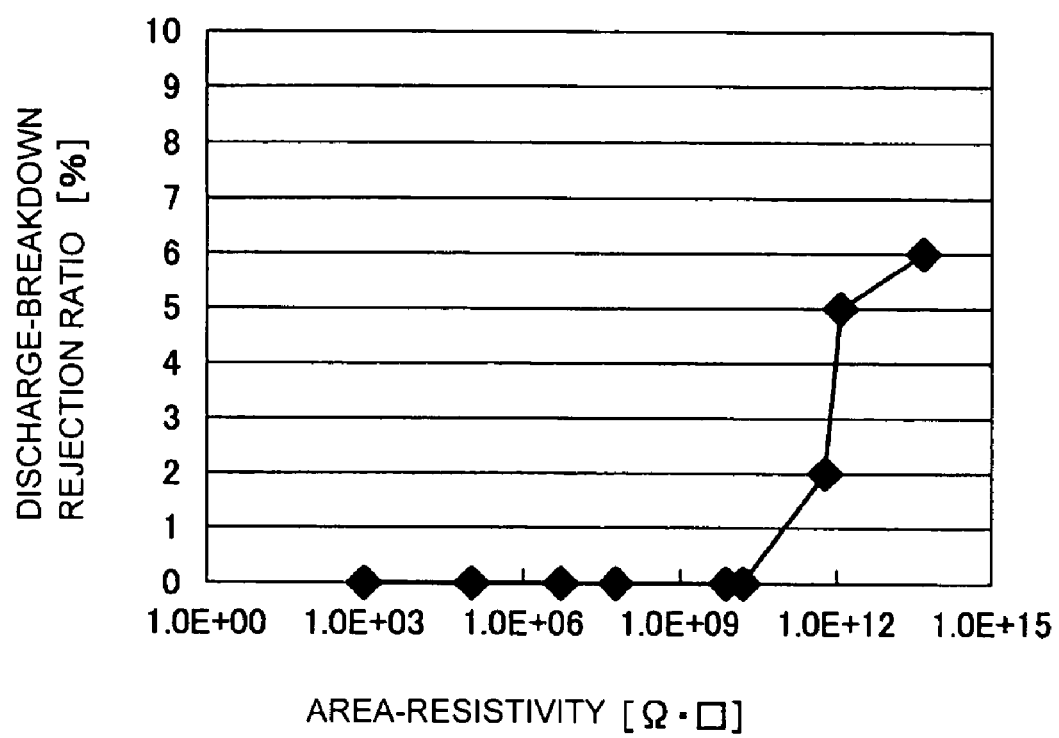
FIG. 20 is a graph illustrating a relationship between the area-resistivity of the resin film and the discharge-breakdown rejection ratio of the surface acoustic wave element.

Moreover, the relationship between the area-resistivities of the conductive layers 54 and 55 and the discharge-breakdown rejection ratios of the surface acoustic wave elements 2 were investigated. FIG. 20 is a graph showing the investigation results. As seen in the graph, preferably, the area-resistivities as the characteristics of the conductive layers 54 and 55 are less than about $10^{10}$ Ω/square.

Figure 24:
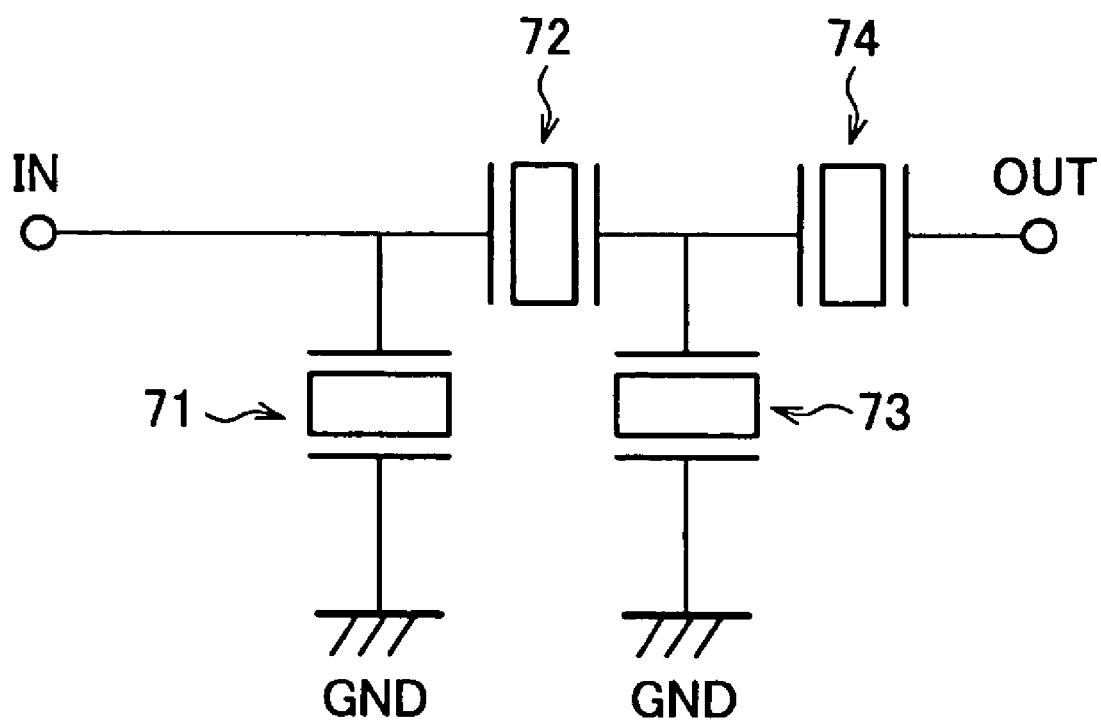
FIG. 24 is a circuit block diagram of a piezoelectric filter defining a piezoelectric component of a preferred embodiment of the present invention.
Figure 25:
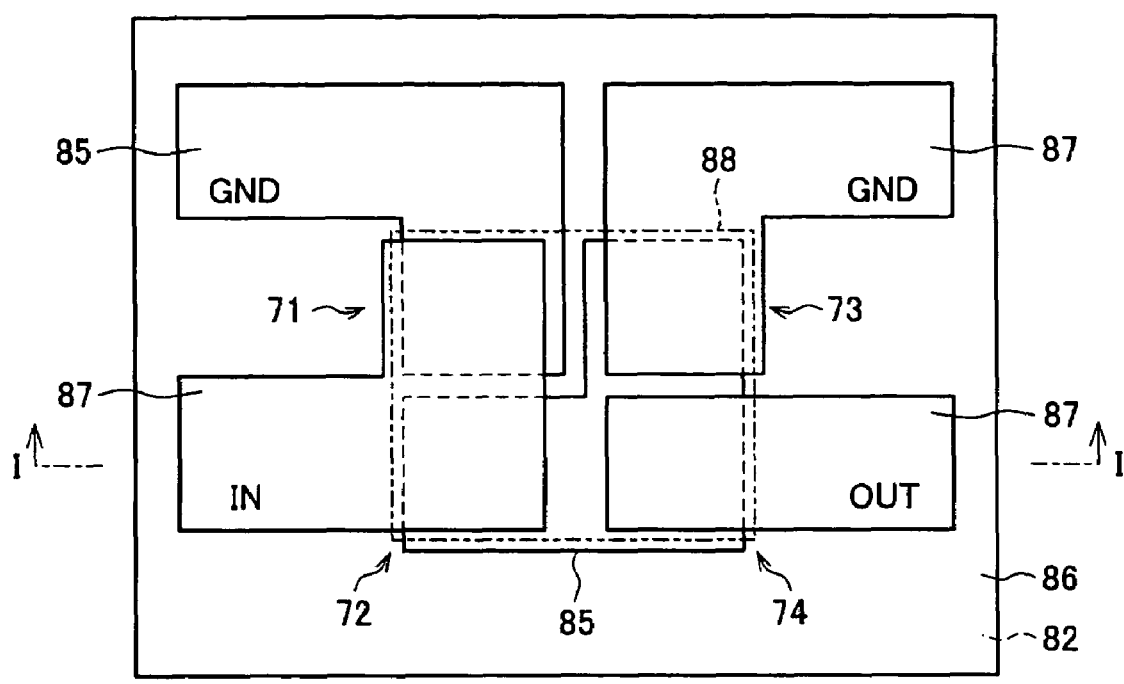
FIG. 25 is a plan view of the piezoelectric filter.
Figure 26:
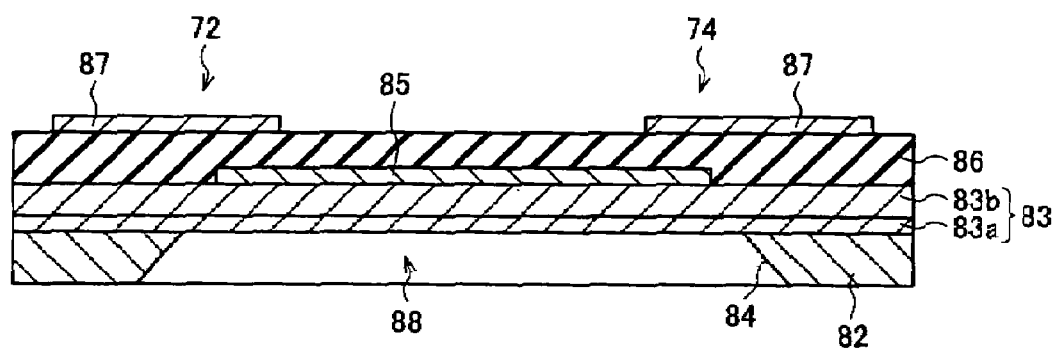
FIG. 26 is a cross-sectional view of the piezoelectric filter taken along line I-I in FIG. 25.

In the above-described preferred embodiments of the present invention, the surface acoustic wave device is preferably a piezoelectric component. The above-described piezoelectric component is not restrictive. As shown in FIGS. 24 and 25, a piezoelectric filter having piezoelectric resonators 71 to 74 arranged in a ladder configuration may be used.

Each of the piezoelectric resonators 72 and 74, which are representative of the piezoelectric resonators 71 to 74, includes an insulating film 83 over the opening 84 of a supporting substrate 82 made of silicon and a piezoelectric thin-film 86 sandwiched between a lower electrode 85 and an upper electrode 87 from the upper and lower directions (the thickness direction of the piezoelectric thin-films 86). The piezoelectric thin film 86 is arranged on the insulating film 83 so as to face the opening 84.

Thus, in the piezoelectric resonators 72 and 74, a diaphragm structure 88 including a vibrating portion can be formed. The vibrating portion includes the piezoelectric thin film sandwiched between the lower electrode 85, the upper electrodes 87, and the insulating film 83. The opening 84 is formed to pass through the supporting substrate 82 in the thickness direction. The insulating film 83 is preferably made of silicon dioxide ($SiO_2$) or alumina ($Al_2O_3$), or has a multi-layer structure made of these substances. The piezoelectric thin film 86 is preferably made of zinc oxide (ZnO), aluminum nitride (AlN), or suitable piezoelectric material.

Figure 27:
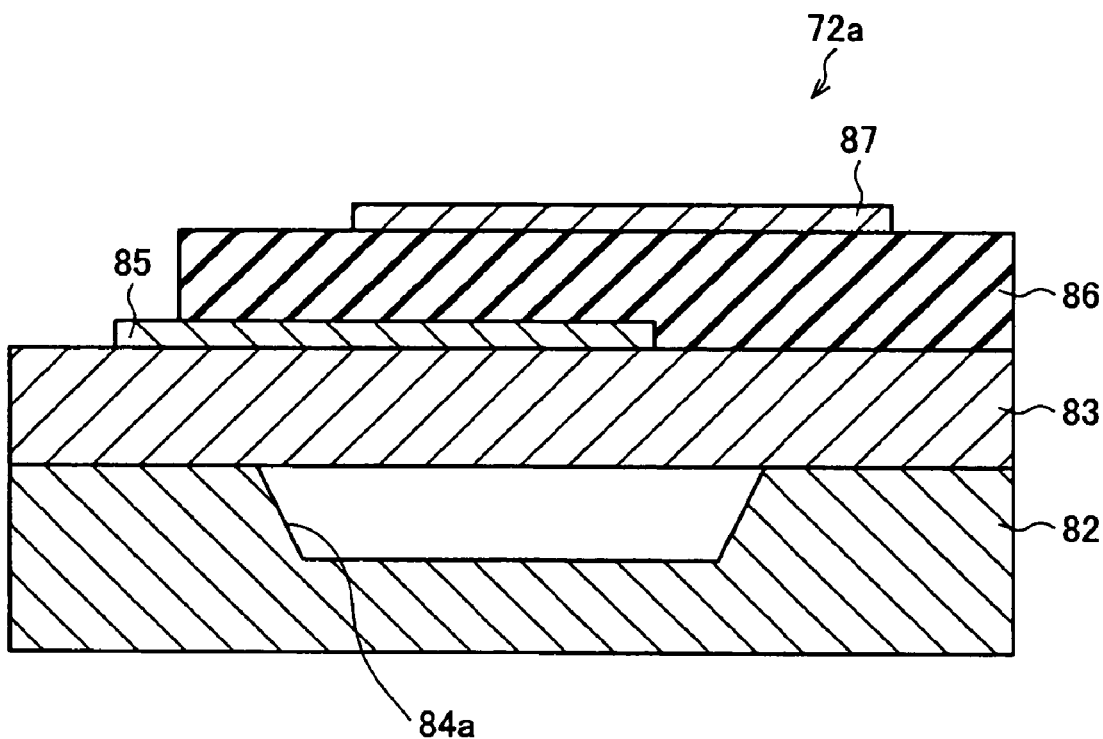
FIG. 27 illustrates a modification of the piezoelectric resonator used in the piezoelectric filter.
Figure 28:
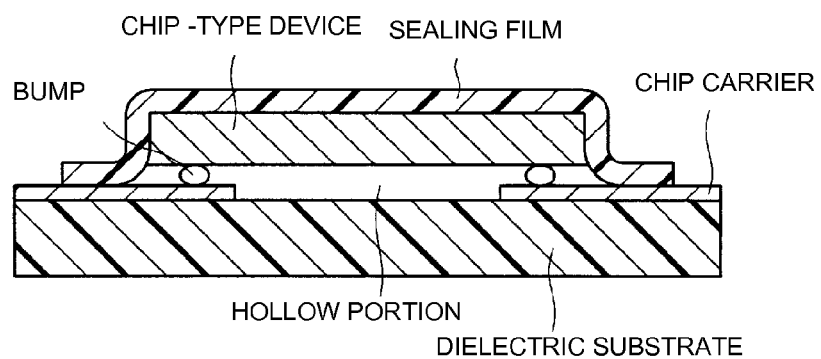
FIG. 28 is a cross-sectional view illustrating a conventional method of bonding a resin film to a mounting substrate.

As shown in FIG. 27, in a piezoelectric resonator 72a, a concavity 84a may be formed in the supporting substrate 82 instead of the opening 84. The concavity 84a opened to face the diaphragm structure and not to pass through the supporting substrate in the thickness direction.

The present invention is not restricted to the above-described preferred embodiments. Different modifications can be made without departing from the scope defined in the claims. The technical scope of the present invention involves preferred embodiments obtained by combination of the technical means disclosed in the different preferred embodiments.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method of producing a piezoelectric component comprising the steps of:
    forming a plurality of piezoelectric elements each having a vibrating portion and a bump on a substrate;
    mounting the plurality piezoelectric elements on a mounting substrate having external terminals via the bumps by flip chip bonding such that the vibrating portions are opposed to the mounting substrate;
    arranging a resin film on the mounting substrate having the plurality of piezoelectric elements mounted thereon;
    sealing the plurality of piezoelectric elements by embedding the resin film between adjacent ones of the piezoelectric elements mounted on the mounting substrate;
    hardening the resin film; and
    splitting the mounting substrate by dicing to form individual piezoelectric components; wherein
    the sealing step includes a step of hot-press bonding in which the resin film is heated, softened, and simultaneously pressed by a roller; and
    a height d of one of the plurality of piezoelectric components, a volume V of said one of the plurality of piezoelectric elements including the bumps and the gap between said one of the plurality of piezoelectric elements and the mounting substrate, a number n of piezoelectric elements per unit area on the mounting substrate, a thickness t1 of the resin film, and an average thickness t2 of the mounting substrate (cross-sectional area/length of substrate) have a relationship expressed by $0.8 < d/(nV+t1+t2) < 1.1$.

2. A method of producing a piezoelectric component comprising the steps of:
    forming a plurality of piezoelectric elements having a vibrating portion and a bump on a substrate;
    mounting the plurality piezoelectric elements on a mounting substrate having external terminals via the bumps by flip chip bonding such that the vibrating portions are opposed to the mounting substrate;
    arranging a resin film on the mounting substrate having the plurality of piezoelectric elements mounted thereon;
    sealing the plurality of piezoelectric elements by embedding the resin film between adjacent ones of the piezoelectric elements mounted on the mounting substrate;
    hardening the resin film; and
    splitting the mounting substrate by dicing to form individual piezoelectric components; wherein
    the sealing step includes a step of hot-press bonding in which the resin film is heated, softened, and simultaneously pressed by a roller;
    in the step of hot-press bonding, the mounting substrate having the piezoelectric elements mounted thereon is fixed to a flat-surface stage for the step of hot-press bonding; and
    a height d of the piezoelectric component, a volume V of one of the plurality of piezoelectric elements including the bumps and the gap between the piezoelectric element and the mounting substrate, a number n of piezoelectric elements per unit area on the mounting substrate, a thickness t1 of the resin film, and an average thickness t2 of the mounting substrate (cross-sectional area/length of substrate) have a relationship expressed by $0.8 < d/(nV+t1+t2) < 1.1$.

3. A method of producing a piezoelectric component according to claim 2, wherein in the sealing step, the step of hot-press bonding step is repeated, and thereafter, a step of pressing the resin film from the upper side thereof is carried out by a mold-frame.

* * * * *